US012672395B2

(12) United States Patent
Kim et al.

(10) Patent No.: US 12,672,395 B2
(45) Date of Patent: Jun. 30, 2026

(54) LIGHT EMITTING DEVICE, DISPLAY APPARATUS INCLUDING THE SAME, AND METHOD OF MANUFACTURING THE SAME

(71) Applicant: SAMSUNG DISPLAY CO., LTD., Yongin-si (KR)

(72) Inventors: Joosung Kim, Seongnam-si (KR); Younghwan Park, Seongnam-si (KR); Dongchul Shin, Suwon-si (KR); Junhee Choi, Seongnam-si (KR); Nakhyun Kim, Yongin-si (KR); Junghun Park, Yongin-si (KR); Eunsung Lee, Seoul (KR); Joohun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 590 days.

(21) Appl. No.: 17/731,829

(22) Filed: Apr. 28, 2022

(65) Prior Publication Data

US 2022/0416120 A1        Dec. 29, 2022

(30) Foreign Application Priority Data

Jun. 25, 2021    (KR) ........................ 10-2021-0082861
Nov. 3, 2021    (KR) ........................ 10-2021-0149958

(51) Int. Cl.
*H10H 20/815*        (2025.01)
*H10H 20/01*        (2025.01)
(Continued)

(52) U.S. Cl.
CPC .......... *H10H 20/815* (2025.01); *H10H 20/01* (2025.01); *H10H 20/01335* (2025.01);
(Continued)

(58) Field of Classification Search
CPC .................. H01L 25/167; H01L 24/24; H01L 2224/24051; H01L 2224/24146;
(Continued)

(56) References Cited

U.S. PATENT DOCUMENTS 6,266,355 B1 * 7/2001 Sverdlov ................ B82Y 20/00
                                                    372/45.01
6,924,159 B2    8/2005 Usui et al.
(Continued)

FOREIGN PATENT DOCUMENTS

JP        2010098070 A  *  4/2010
JP        2010-536182 A    11/2010
(Continued)

OTHER PUBLICATIONS

EPO machine translation of JP 2010098070 A (Year: 2010).*
(Continued)

*Primary Examiner* — William B Partridge
*Assistant Examiner* — Linda J. Fleck
(74) *Attorney, Agent, or Firm* — Sughrue Mion, PLLC

(57)        ABSTRACT
A light emitting device may be a bar-type light emitting device and include a n-GaN semiconductor layer, a p-GaN semiconductor layer spaced apart from the n-GaN semiconductor layer, an active layer arranged between the n-GaN semiconductor layer and the p-GaN semiconductor layer, and a strain relaxing layer including indium clusters and voids.

18 Claims, 23 Drawing Sheets

(51) Int. Cl.

| | |
|---|---|
| *H10H 20/825* | (2025.01) |
| *H10H 20/84* | (2025.01) |
| *H10W 70/60* | (2026.01) |
| *H10W 90/00* | (2026.01) |
| *H10W 90/22* | (2026.01) |

(52) U.S. Cl.
CPC ............. *H10H 20/84* (2025.01); *H10W 90/00* (2026.01); *H10H 20/825* (2025.01); *H10W 70/60* (2026.01); *H10W 90/22* (2026.01)

(58) Field of Classification Search
CPC ...... H01L 2224/24147; H10H 20/0133; H10H 20/8142; H10H 20/815; H10H 20/825; H10H 20/824; H10H 20/01; H10H 20/01335; H10H 20/84; H10H 20/8215; H10H 20/0137; H10H 20/819; H10H 29/142; H10D 30/0415; H10D 84/858; H10D 62/113; H10D 10/821; H10D 86/40; A01N 1/146; H05K 5/10; H02K 15/0273; H10W 90/00; H10W 90/22; H10W 70/60

See application file for complete search history.

(56) References Cited

U.S. PATENT DOCUMENTS

| | | | | |
|---|---|---|---|---|
| 9,828,695 | B2 | 11/2017 | Hirai et al. | |
| 12,408,491 | B2 * | 9/2025 | Dupre | H10H 20/8252 |
| 2001/0035531 | A1 * | 11/2001 | Kano | H01L 21/02507 257/190 |
| 2006/0255341 | A1 * | 11/2006 | Pinnington | H10H 20/018 257/E33.068 |
| 2008/0315226 | A1 * | 12/2008 | Kuo | H10H 20/815 257/97 |
| 2010/0075483 | A1 * | 3/2010 | Ohno | C30B 25/165 257/E21.09 |
| 2010/0108985 | A1 * | 5/2010 | Chung | H10H 20/817 257/14 |
| 2011/0073888 | A1 * | 3/2011 | Ueno | B82Y 20/00 438/46 |
| 2011/0243172 | A1 * | 10/2011 | Lin | B82Y 20/00 438/47 |
| 2011/0309327 | A1 | 12/2011 | Jeong | |
| 2014/0217417 | A1 * | 8/2014 | Horie | H10H 20/825 257/98 |
| 2014/0291612 | A1 * | 10/2014 | Aihara | H10H 20/84 438/27 |
| 2015/0053917 | A1 * | 2/2015 | Hayashi | H02K 15/0273 257/13 |
| 2015/0364319 | A1 | 12/2015 | Park et al. | |
| 2016/0072007 | A1 | 3/2016 | Choi et al. | |
| 2017/0040490 | A1 | 2/2017 | Lee et al. | |
| 2017/0141262 | A1 * | 5/2017 | Wang | H10H 20/825 |
| 2017/0179681 | A1 * | 6/2017 | Barwicz | H10D 84/038 |
| 2018/0145213 | A1 | 5/2018 | Jang et al. | |
| 2018/0158987 | A1 * | 6/2018 | Lee | H10K 59/00 |
| 2019/0006821 | A1 * | 1/2019 | Tang | H01S 5/1064 |
| 2019/0189843 | A1 * | 6/2019 | Choi | H10H 20/01335 |
| 2019/0207057 | A1 | 7/2019 | Kang et al. | |
| 2020/0227255 | A1 | 7/2020 | Zhu et al. | |
| 2020/0411492 | A1 | 12/2020 | Ju et al. | |
| 2024/0274751 | A1 * | 8/2024 | Kim | H10F 30/21 |

FOREIGN PATENT DOCUMENTS

| | | | | | |
|---|---|---|---|---|---|
| KR | 10-2011-0138726 | A | | 12/2011 | |
| KR | 20120047073 | A | * | 5/2012 | H10H 20/825 |
| KR | 10-2013-0007316 | A | | 1/2013 | |
| KR | 10-2014-0084621 | A | | 7/2014 | |
| KR | 20140099687 | A | * | 8/2014 | H10H 20/825 |
| KR | 10-2014-0126627 | A | | 10/2014 | |
| KR | 10-2016-0029982 | A | | 3/2016 | |
| KR | 10-2017-0016544 | A | | 2/2017 | |
| KR | 10-2019-0073133 | A | | 6/2019 | |
| KR | 10-2019-0079787 | A | | 7/2019 | |
| WO | WO-2015102343 | A1 | * | 7/2015 | H10H 20/815 |
| WO | WO-2023003446 | A1 | * | 1/2023 | H10H 20/825 |

OTHER PUBLICATIONS

Smalc-Koziorowska, et al., "8Role of Metal vacancies in the Mechanism of Thermal Degradation of InGaN Quantum Wells," ACS Appl. Mater. Interfaces 2021, 13, 7476-7484. https://doi.org/10.1021/acsami.0c21293 (Year: 2021).*

Arteev, et al., "Investigation of Statistical Broadenings in InGaN Alloys, " J. Phys.: Conf. Ser. 1135 012050 doi:10.1088/1742-6596/1135/1/012050 (Year: 2018).*

Z Dridi, et al., "First-principles investigation of lattice constants and bowing parameters in wurtzite AlxGal—xN, InxGal—xN and InxAl1—xN alloys," Semicond. Sci. Technol. 18 (2003) 850-856. (Year: 2003).*

Communication dated Nov. 30, 2022, issued by the European Patent Office in counterpart European Application No. 22178144.6.

Liu, et al., "Unintentionally doped high resistivity GaN layers with an InGaN interlayer grown by MOCVD", 2016, RSC Advances, vol. 6,6 pages total.

Liu, et al., "Degradation Mechanism of Crystalline Quality and Luminescence in $In_{0.42}Ga_{0.58}N$/GaN Double Heterostructures with Porous InGaN Layer", 2017, Journal of Physical Chemistry, vol. 121, 7 pages total.

Smalc-Koziorowska, et al., "Role of Metal Vacancies in the Mechanism of Thermal Degradation of InGaN Quantum Wells", 2021, American Chemical Society Applied Materials & Interfaces, vol. 13, 9 pages total.

Feng, et al., "Cluster size and composition variations in yellow and red light-emitting InGaN thin films upon thermal annealing", 2004, Journal of Applied Physics, vol. 95, 10 pages total, https://doi.org/10.1063/1.1703828.

Bulashevich, et al., "Impact of surface recombination on efficiency of III-nitride light-emitting diodes", 2016, Phys. Status Solidi RRL, vol. 10, Issue 6, 5 pages total.

Pasayat, et al., "Compliant Micron-Sized Patterned InGaN Pseudo-Substrates Utilizing Porous GaN", 2020, Materials, vol. 13, 10 pages total, doi:10.3390/ma13010213.

Chan, et al., "Demonstration of relaxed InGaN-based red LEDs grown with high active region temperature", 2021, Applied Physics Express, vol. 14, 5 pages total, https://doi.org/10.35848/1882-0786/ac251d.

Miao, Cao et al., "GaN Overgrowth on Thermally Etched Nanoporous GaN Template", Japanese Journal of Applied Physics, vol. 52, 2013. (4 pages total).

Communication issued on Feb. 10, 2026 by the Korean Ministry of Intellectual Property (MOIP) in Korean Patent Application No. 10-2022-0051657.

* cited by examiner

LATTICE CONSTANT AND WAVELENGTH OF NITRIDE

CONVENTIONAL LED EFFICIENCY (1mmX1mm)

GROW FIRST SEMICONDUCTOR LAYER AND
STRAIN SOURCE LAYER ON BASE SUBSTRATE — S210

FORM STRAIN RELAXING LAYER INCLUDING INDIUM PARTICLES
AND VOIDS THROUGH HEAT TREATMENT — S220

GROW ACTIVE LAYER AND SECOND SEMICONDUCTOR LAYER
ON STRAIN RELAXING LAYER — S230

OBTAIN MULTIPLE LIGHT EMITTING DEVICES BY ETCHING
SEMICONDUCTOR STRUCTURE — S240

LIGHT EMITTING DEVICE, DISPLAY APPARATUS INCLUDING THE SAME, AND METHOD OF MANUFACTURING THE SAME

CROSS-REFERENCE TO RELATED APPLICATIONS

This application is based on and claims priority under 35 U.S.C. § 119 to Korean Patent Application Nos. 10-2021-0082861, filed on Jun. 25, 2021 and 10-2021-0149958 filed on Nov. 3, 2021 in the Korean Intellectual Property Office, the disclosures of which are incorporated by reference herein in their entirety.

BACKGROUND

1. Field

The disclosure relates to light emitting devices, display apparatuses including the light emitting devices, and methods of manufacturing the same.

2. Description of the Related Art

Compared to existing light sources, light emitting diodes have a relatively long lifespan, low power consumption, fast response speed, high environment-friendliness, etc., and have been used in various products including a lighting system, a backlight of a display apparatus, etc. In particular, light emitting diodes based on group 3 nitrides advantageously inhibit surface movement of electrical carriers and have high heat and wear resistance. For example, group 3 nitrides such as gallium nitride (GaN), aluminum gallium nitride (AlGaN), indium aluminum gallium nitride (InAlGaN), etc. have functioned as light emitting devices for light emission.

SUMMARY

Provided are light emitting devices capable of performing high-efficiency light emission and methods of manufacturing the same.

Provided are light emitting devices capable of reducing lattice defects and methods of manufacturing the same.

Provided are electronic apparatuses capable of high-efficiency light emission.

Additional aspects will be set forth in part in the description which follows and, in part, will be apparent from the description, or may be learned by practice of the presented embodiments of the disclosure.

In accordance with an aspect of the disclosure, a Gallium-Nitride light emitting device includes a n-GaN semiconductor layer doped with an n-type dopant; a p-GaN semiconductor layer spaced apart from the n-GaN semiconductor layer and doped with a p-type dopant; an active layer arranged between the n-GaN semiconductor layer and the p-GaN semiconductor layer, the active layer configured to emit light; and a strain relaxing layer including indium clusters and voids, the strain relaxing layer being configured to relax strain generated by a lattice constant difference between the n-GaN semiconductor layer and the active layer.

Each of the indium clusters may include two or more indium atoms.

For each of the indium clusters, the two or more indium atoms may be metallically bonded.

A ratio of a total volume of the indium clusters to a total volume of the strain relaxing layer may be less than or equal to a ratio of a total volume of the voids to the total volume of the strain relaxing layer.

A ratio of a total volume of the indium clusters to a total volume of the strain relaxing layer may be greater than or equal to 0.01 and less than or equal to 0.3.

The strain relaxing layer may include $In_{x-y}Ga_{1-x}N$ ($0<y<x<1$).

A size of each of the voids may be greater than or equal to about 10 nm and less than or equal to about 500 nm.

The lattice constant difference between the n-GaN semiconductor layer and the active layer may be greater than or equal to 0.02 and less than or equal to 0.05.

The strain relaxing layer may be arranged between the n-GaN semiconductor layer and the active layer.

A gap between the strain relaxing layer and the active layer may be less than about 1 μm.

The strain relaxing layer may contact the n-GaN semiconductor layer.

The light emitting device may further include a planarization layer arranged between the active layer and the strain relaxing layer, the planarization layer configured to planarize a surface of the strain relaxing layer.

The planarization layer may include at least one of AlGaN, InGaN, and AlInGaN.

The light emitting device may further include a plurality of the strain relaxing layers and a plurality of the planarization layers, wherein the plurality of strain relaxing layers and the plurality of planarization layers are arranged alternately in a length direction of the light emitting device towards the active layer from the n-GaN semiconductor layer.

The plurality of strain relaxing layers may include a first strain relaxing layer having a first thickness and a second strain relaxing layer having a second thickness that is greater than the first thickness, and an average size of the voids in the second strain relaxing layer may be greater than an average size of the voids in the first strain relaxing layer.

The second strain relaxing layer may be arranged between the active layer and the first strain relaxing layer.

The light emitting device may further include a third semiconductor layer arranged between the active layer and the strain relaxing layer.

The third semiconductor layer and the n-GaN semiconductor layer may include a same material.

A thickness of the third semiconductor layer may be less than or equal to a thickness of the n-GaN semiconductor layer.

An indium content of the active layer may be greater than or equal to 20%.

The active layer may be configured to emit light having a wavelength of about 500 nm to about 750 nm.

The width of the light emitting device may be about 0.3 μm to about 1 μm, and a ratio of the length of the light emitting device to the width of the light emitting device may be greater than or equal to 3.

In accordance with an aspect of the disclosure, a display apparatus includes a display device layer comprising a plurality of light emitting devices; and a driving device layer comprising a plurality of transistors electrically connected to the plurality of light emitting devices, the driving device layer configured to drive the plurality of light emitting devices, wherein at least one of the plurality of light emitting devices comprises the Gallium-Nitride light emitting device of an above-noted aspect of the disclosure.

The at least one of the plurality of light emitting devices may be configured to emit light having a wavelength of about 500 nm to about 750 nm.

The plurality of light emitting devices may further include a first light emitting device configured to emit light having a wavelength of about 620 nm to about 750 nm, a second light emitting device configured to emit light having a wavelength of about 495 nm to about 570 nm and a third light emitting device configured to emit light having a wavelength of about 420 nm to about 495 nm.

The first light emitting device, the second light emitting device, and the third light emitting device may have indium contents different from each other.

In accordance with an aspect of the disclosure, a method of manufacturing a light emitting device includes growing a n-GaN semiconductor layer on a base substrate; growing a strain source layer comprising indium on the n-GaN semiconductor layer; heat-treating the strain source layer to form a strain relaxing layer comprising a plurality of indium clusters and a plurality of voids; growing an active layer on the strain relaxing layer; and growing a p-GaN semiconductor layer on the active layer to form a Gallium-Nitride light emitting structure.

The heat-treating of the strain source layer may include applying, to the strain source layer, a heat-treating temperature higher than a growth temperature of the strain source layer.

The heat-treating temperature may be at least 100° C. greater than the growth temperature.

The heat-treating of the strain source layer may include separating indium atoms in the strain source layer from other materials in the strain source layer and causing the separated indium atoms to bond to each other to form the plurality of indium clusters.

The heat-treating of the strain source layer may include applying heat to the strain source layer in a nitrogen or ammonia-mixed atmosphere.

BRIEF DESCRIPTION OF THE DRAWINGS

The above and other aspects and features of exemplary embodiments of the disclosure will be more apparent from the following description taken in conjunction with the accompanying drawings, in which:

FIG. 1 is a cross-sectional view showing a light emitting device according to an embodiment;

FIG. 8 is a diagram illustrating a light emitting device including a plurality of layers between a first semiconductor layer and an active layer according to an embodiment;

FIG. 15 is a diagram illustrating a part of a display apparatus including a nitride semiconductor layer according to an embodiment;

DETAILED DESCRIPTION

Figure 2A:
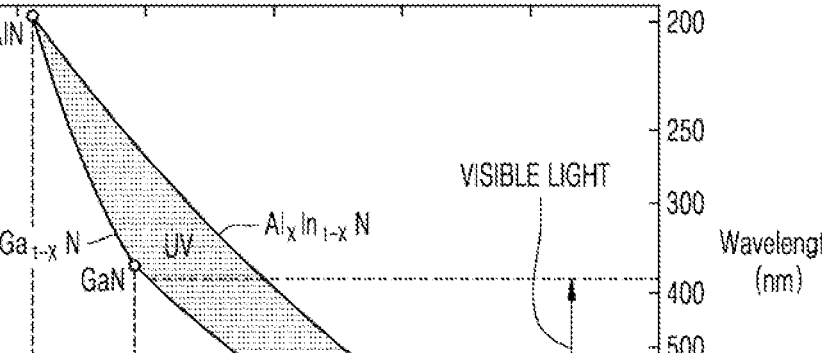
FIG. 2A is a diagram showing a lattice constant, an energy band, and an emitted wavelength according to a material of an active layer.

Reference will now be made in detail to embodiments, examples of which are illustrated in the accompanying drawings, wherein like reference numerals refer to like elements throughout. In this regard, embodiments may have different forms and should not be construed as being limited to the descriptions set forth herein. Accordingly, embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Embodiments will now be described in detail with reference to the accompanying drawings. The embodiments described herein are provided merely as an example, and various modifications may be made from the embodiments. Like reference numerals in the drawings denote like elements, and sizes of components in the drawings may be exaggerated for clarity and convenience of explanation.

It will be understood that when a component is referred to as being "on" another component or on "upper part" of another component, the component can be directly on the other component or over the other component in a non-contact manner.

While such terms as "first," "second," etc., may be used to describe various components, such terms are used only to distinguish one component from another. These terms are not intended to define that materials or structures of components are different.

An expression used in the singular encompasses the expression of the plural, unless it has a clearly different meaning in the context. When a portion "includes" an element, another element may be further included, rather than excluding the existence of the other element, unless otherwise described.

Moreover, the terms "part," "module," etc. refer to a unit processing at least one function or operation, and may be implemented by a hardware, a software, or a combination thereof.

The use of the terms "a" and "an" and "the" and similar referents in the context of describing embodiments (especially in the context of the following claims) are to be construed to cover both the singular and the plural.

Also, the steps of all methods described herein can be performed in any suitable order unless otherwise indicated herein. The use of any and all example languages (e.g., "such as") provided herein, are intended merely to better illuminate the technical ideas and does not pose a limitation on the scope of rights unless otherwise claimed.

Figure 1:
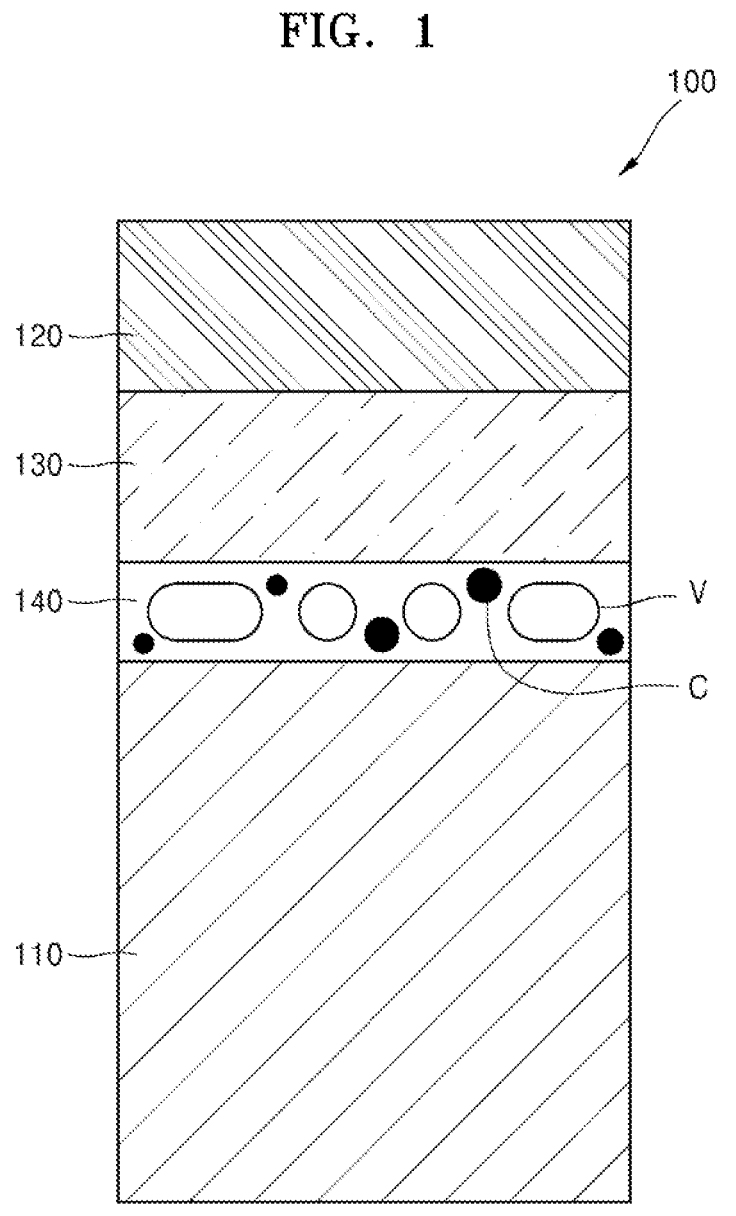

FIG. 1 is a cross-sectional view showing a light emitting device 100 according to an embodiment. As shown in FIG. 1, the light emitting device 100 may include an inorganic material-based semiconductor material, and may emit light of a particular wavelength according to a material included in the light emitting device 100.

The light emitting device 100 may be any one of various types of micro-sized or nano-sized light emitting devices. For example, a width, a diameter, or a thickness of the light emitting device 100 may be less than or equal to about 1000 μm, less than or equal to about 200 μm, less than or equal to about 100 μm, or less than or equal to about 50 μm. The light emitting device 100 may have a bar shape having a length greater than a width. For example, the light emitting device 100 may have a width in a range from 0.3 μm to 1 μm, and a ratio of length to width may be greater than or equal to about 3. However, the disclosure is not limited thereto. The length of the light emitting device 100 may be in a range from about 1 μm to about 5 μm. The light emitting device 100 may include a light emitting diode (LED), a vertical-cavity surface-emitting laser (VCSEL), etc.

The light emitting device 100 may include a first semiconductor layer 110, a second semiconductor layer 120 apart from the first semiconductor layer 110, and an active layer 130 arranged between the first semiconductor layer 110 and second semiconductor layer 120 and emitting light.

The first semiconductor layer 110 may be a semiconductor layer doped with a first dopant. For example, the first semiconductor layer 110 may include an n-type semiconductor. However, the disclosure is not limited thereto, and in some cases, the first semiconductor layer 110 may include a p-type semiconductor. The first semiconductor layer 110 may have a single-layer structure or a multi-layer structure. The first semiconductor layer 110 may include, for example, InAlGaN, GaN, AlGaN and/or InGaN, and may include a semiconductor layer doped with a dopant, such as Si, Ge, Sn, etc.

The second semiconductor layer 120 may be a semiconductor layer doped with a second dopant that is different from the first dopant. For example, the second semiconductor layer 120 may include a p-type semiconductor. The second semiconductor layer 120 may include III-V group p-type semiconductors, for example, p-GaN. The second semiconductor layer 120 may have a single-layer structure or a multi-layer structure. For example, the second semiconductor layer 120 may include at least one semiconductor material of InAlGaN, GaN, AlGaN, InGaN, AlN, and InN, and may be a semiconductor layer doped with a conductive dopant such as Mg, etc.

The active layer 130 may be arranged between the first semiconductor layer 110 and the second semiconductor layer 120. The active layer 130 may generate light through the bonding of electrons and holes, and may have a multi-quantum well (MQW) structure or a single-quantum well (SQW) structure. The active layer 130 may include III-V group semiconductors, for example, InGaN, GaN, AlGaN, AlInGaN, etc. A clad layer doped with a conductive dopant may be formed at the top and/or bottom of the active layer 130. For example, the clad layer may be implemented as an AlGaN layer or an InAlGaN layer.

The light emitting device 100 may further include another clad layer and/or an electrode at the top and/or bottom of each layer, in addition to the first semiconductor layer 110, the active layer 130, and the second semiconductor layer 120.

A wavelength of emitted light may vary according to a content of material included in the active layer 130. FIG. 2A is a diagram showing a lattice constant, an energy band, and an emitted wavelength according to a material of an active layer. As illustrated in FIG. 2A, the higher the indium (In) content is, the greater (e.g. longer) a wavelength of emitted light may be. For example, when the indium content of the active layer 130 is about 15%, the active layer 130 may emit blue light of about 450 nm, and when the indium content of the active layer 130 is about 25%, the active layer 130 may emit green light of about 520 nm. Furthermore, when the indium content of the active layer 130 is about 30%, the active layer 130 may emit yellow light of about 560 nm, and when the indium content of the active layer 130 is about 35%, the active layer 130 may emit red light of about 630 nm.

Figure 2B:
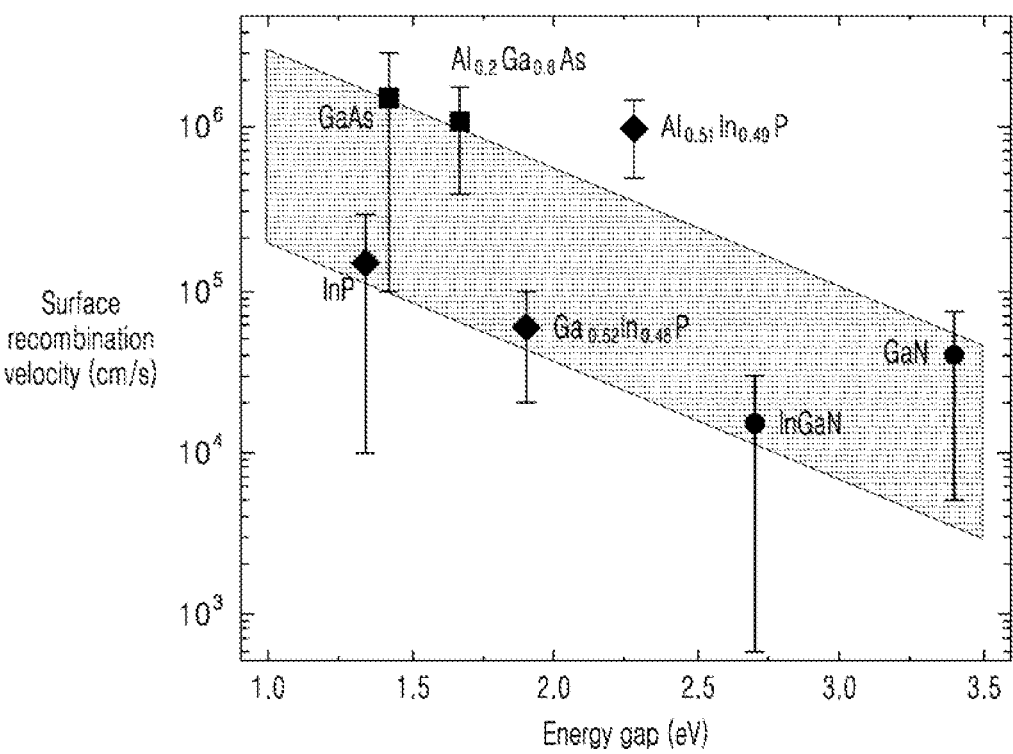
FIG. 2B is a diagram showing a relationship between an energy band gap and a surface recombination velocity of an active layer.

FIG. 2B is a diagram showing a relationship between an energy band gap and a surface recombination velocity of an active layer. As illustrated in FIG. 2B, in general, a nitride semiconductor has a larger energy band gap than a gallium arsenide semiconductor. Also, the higher the energy band gap is, the lower a surface recombination velocity may be. Accordingly, when forming the active layer 130 using a nitride semiconductor, a decrease in a surface leakage current may be expected in spite of a narrow width. In particular, when indium is included in an active layer, the surface recombination velocity may decrease remarkably compared to other semiconductor materials. This may be due to a localized state formed by agglomerated indium in the active layer 130.

The light emitting device 100 according to an embodiment may be a micro-sized light emitting device, and accordingly, the active layer 130 may include a nitride semiconductor based on InGaN. In particular, in the case of a light emitting device having a width less than a length, the surface leakage current may be reduced by using an InGaN-based nitride semiconductor as an active layer.

Figure 2C:
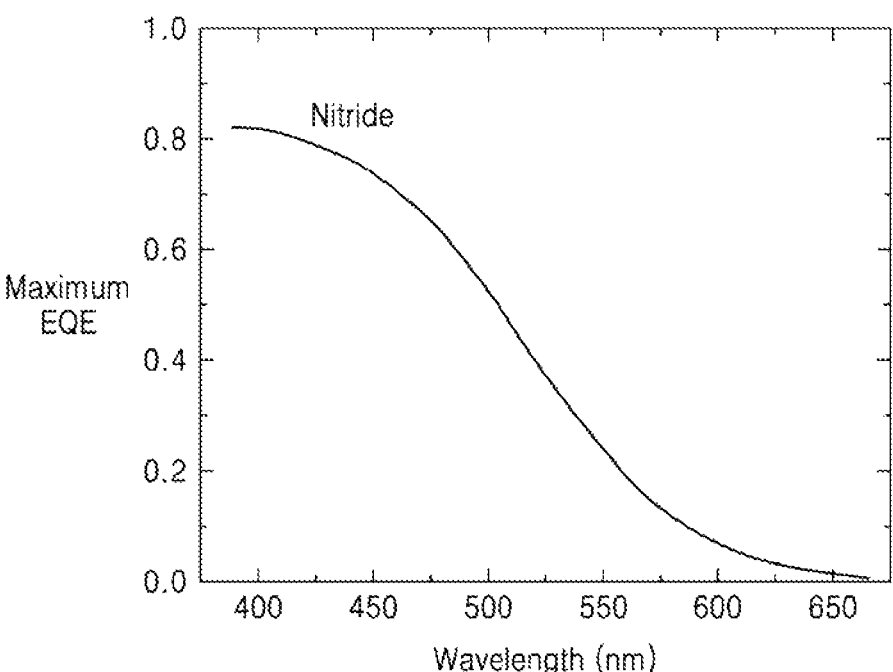
FIG. 2C illustrates a comparative example with a graph showing a luminous efficiency according to a wavelength of an active layer in a light emitting device including n-type GaN/InGaN/p-type GaN.

Meanwhile, in FIG. 2A, the higher the indium content in the active layer 130 is, the greater a lattice constant may be. FIG. 2C illustrates a comparative example with a graph showing a luminous efficiency according to a wavelength of the active layer 130 in a light emitting device including n-type GaN/InGaN/p-type GaN. With reference to FIGS. 2A and 2C, the higher the indium content in the active layer is, the greater the wavelength of emitted light may become, and accordingly, the efficiency of the light emitting device may be significantly decreased.

Specifically, when the active layer includes a material emitting blue light of about 450 nm, a maximum value of external quantum efficiency (EQE) may be about 0.7. However, when the active layer includes a material emitting red light of about 630 nm, the maximum value of external quantum efficiency may be less than 0.1.

This is because a higher indium content causes a lattice mismatch in a light emitting device, for example, between InGaN and GaN. The lattice mismatch may give rise to strain in the active layer or a defect, thereby decreasing bonding efficiency of carriers.

The light emitting device 100 according to an embodiment may include a strain relaxing layer 140 relaxing strain that occurs due to a lattice constant difference between the active layer 130 and the first semiconductor layer 110. The strain relaxing layer 140 may be arranged between the first semiconductor layer 110 and the active layer 130. The lattice constant difference between the first semiconductor layer 110 and the active layer 130 may be greater than or equal to 0.02 and less than or equal to 0.05.

The strain relaxing layer 140 may include a semiconductor material. The strain relaxing layer 140 may include III-V group semiconductor materials, and may have a single-layer structure or a multi-layer structure. The strain relaxing layer 140 may include at least one semiconductor material of InAlGaN, GaN, AlGaN, InGaN, and InN. For example, the strain relaxing layer 140 may be $In_{x-y}Ga_{1-x}N$ ($0<y<x<1$). In a process of manufacturing the light emitting device 100, a source material provided to form the strain relaxing layer 140 may be $In_xGa_{1-x}N$ ($0<x<1$), and as indium is separated from $In_xGa_{1-x}N$ ($0<x<1$) during a heat treatment process, a matrix material of the strain relaxing layer 140 may include $In_{x-y}Ga_{1-x}N$ ($0<y<x<1$).

The strain relaxing layer 140 may include a plurality of indium clusters C and a plurality of voids V. A ratio of total volume of the plurality of indium clusters C to a total volume of the strain relaxing layer 140 may be greater than or equal to about 0.01 and less than or equal to about 0.3, and the ratio of total volume of the plurality of indium clusters C to the total volume of the strain relaxing layer 140 may be less than or equal to a ratio of total volume of the plurality of voids V to the total volume of the strain relaxing layer 140.

The plurality of indium clusters C may be indium crystals. Each of the plurality of indium clusters C may include two or more indium atoms. The indium atoms in the indium cluster C may be metallically bonded. Each of the plurality of indium clusters C may be a single-crystal, a poly-crystal, or an amorphous crystal. A plurality of adjacent indium clusters C of the plurality of indium clusters C may or may not be connected to each other. The plurality of indium clusters C may not be chemically bonded to other materials included in the strain relaxing layer 140, and may simply be mixed in a matrix material of the strain relaxing layer 140.

The size of the plurality of indium clusters C may vary. For example, the size of the plurality of indium clusters C may be greater than or equal to about 1 nm and less than or equal to about 1 μm. The size of the plurality of indium clusters C may be greater than or equal to about 10 nm and less than or equal to about 500 nm. In the process of manufacturing the light emitting device 100, the plurality of indium atoms included in $In_xGa_{1-x}N$ ($0<x<1$) may be separated from the $In_xGa_{1-x}N$ ($0<x<1$) due to the heat treatment process, and the indium atoms may be bonded to each other to form the plurality of indium clusters C.

The strain relaxing layer 140 may include a plurality of voids V. The plurality of voids V may refer to an empty space in the strain relaxing layer 140, and among the plurality of voids V, adjacent voids V may or may not be connected to each other. The size of the plurality of voids V may vary. For example, the size of the plurality of voids V may be greater than or equal to about 1 nm and less than or equal to about 1 μm. The size of the plurality of voids V may be greater than or equal to about 10 nm and less than or equal to about 500 nm. The plurality of voids V may be generated by joining of spaces generated due to the indium atoms left in the process of manufacturing the light emitting device 100.

As the strain relaxing layer 140 includes the plurality of voids V, the strain generated due to a lattice constant difference with other adjacent layers, for example, the first semiconductor layer 110 or the active layer 130, may be relaxed. For example, the active layer 130 may emit light of a wavelength greater than or equal to about 500 nm, and the indium content therein may be greater than or equal to 20%. Alternatively, the active layer 130 may emit light of a wavelength of about 620 nm to 750 nm, and the indium content therein may be greater than or equal to 35%. Even in the case of a large lattice constant difference between the first semiconductor layer 110 and the active layer 130, the strain relaxing layer 140 may provide a buffering action between the first semiconductor layer 110 and the active layer 130, which may facilitate growth of the first semiconductor layer 110, the strain relaxing layer 140, and the active layer 130. However, the disclosure is not limited thereto. The strain relaxing layer 140 according to an embodiment may be applied to the light emitting device 100 emitting light of different wavelengths, such as blue light, green light, etc.

Figure 3:
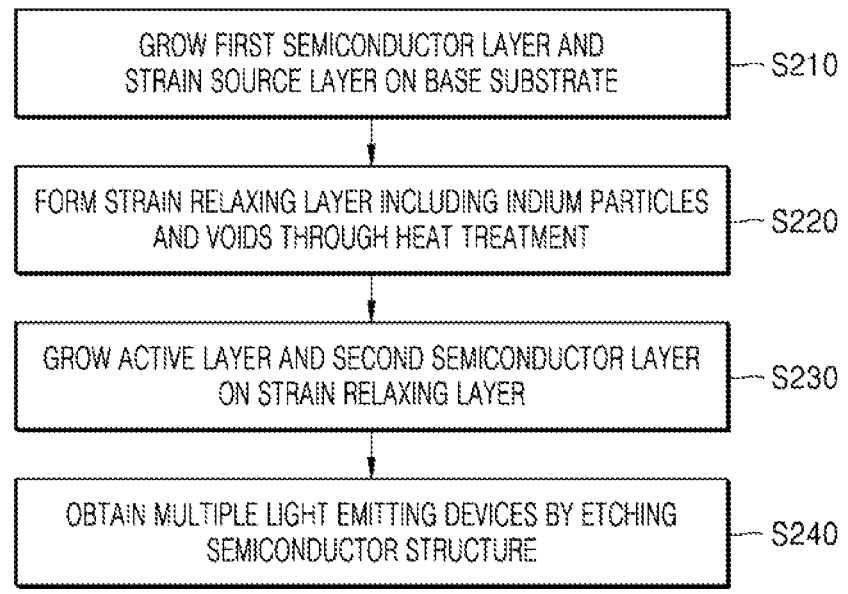
FIG. 3 is a flowchart illustrating a method of manufacturing a light emitting device, according to an embodiment.

FIG. 3 is a flowchart illustrating a method of manufacturing the light emitting device 100, according to an embodiment. With reference to FIG. 3, the first semiconductor layer 110 and a strain source layer may be grown on a base substrate (S210).

The base substrate may be a substrate to grow the light emitting device 100. The base substrate may include various materials used in general semiconductor processes. For example, a silicon substrate or a sapphire substrate may be used as the base substrate.

The first semiconductor layer 110 and the strain source layer may be formed of different semiconductor materials. The first semiconductor layer 110 may include an n-type semiconductor. The first semiconductor layer 110 may include, for example, GaN and/or AlGaN, and may include a semiconductor layer doped with a conductive dopant, such as Si, Ge, Sn, etc. The strain source layer may include III-V group semiconductor materials, and may have a single-layer structure or a multi-layer structure. The strain source layer may be a semiconductor layer including indium. For example, the strain source layer may include at least one semiconductor material of InAlGaN, InGaN, and InN. The indium content of the strain source layer may be greater than or equal to 5% and less than 35%. For example, the strain source layer may include $In_xGa_{(1-x)}$ ($0.05 \leq x < 0.30$). When the indium content of the strain source layer is too low, the indium clusters C and the voids V may not be formed, and when the indium content of the strain source layer is too high (e.g., greater than or equal to 30%), the growth of the strain source layer may be challenged due to the lattice constant difference between the first semiconductor layer 110 and the strain source layer.

The first semiconductor layer 110 and the strain source layer may be formed using various methods, including metal organic chemical vapor deposition (MOCVD), chemical vapor deposition (CVD), plasma-enhanced chemical vapor deposition (PECVD), molecular beam epitaxy (MBE), hydride vapor phase epitaxy (HVPE), etc.

By heat-treating the strain source layer, a strain relaxing layer including the plurality of indium clusters C and the plurality of voids V may be formed (S220). The strain source layer may be heat-treated with a temperature (e.g., a heat-treating temperature) higher than a growth temperature. The heat treatment temperature may vary according to an indium content, pressure, etc. For example, the size of the indium clusters C and voids V formed may increase as the applied temperature increases. For example, the size of the indium clusters C and voids V formed may increase as the duration of the heat treatment increases. The heat treatment temperature may be 100° C. greater than or equal to the growth temperature. For example, after growing the strain source layer while applying a temperature of about 600° C., the strain source layer may be heat-treated at a temperature in the range of about 700° C. to about 900° C. When heat is applied to the strain source layer, the indium atoms included in the strain source layer may be separated from the chemical bond with other materials (for example, gallium or nitrogen) included in the strain source layer. The separated indium atoms may move and form indium clusters made of bonded indium atoms. The indium cluster may be formed by metallic bond of two or more indium atoms. The formed indium clusters may be in a state where they are not chemically bonded to other atoms, for example, to gallium and/or nitrogen. Furthermore, the spaces the indium atoms have left may be joined together to form the void V.

The heat treatment may be performed in a nitrogen ($N_2$) atmosphere or an ammonia ($NH_3$)-mixed atmosphere. The nitrogen or ammonia may prevent surface deterioration of the strain source layer.

Figure 4:
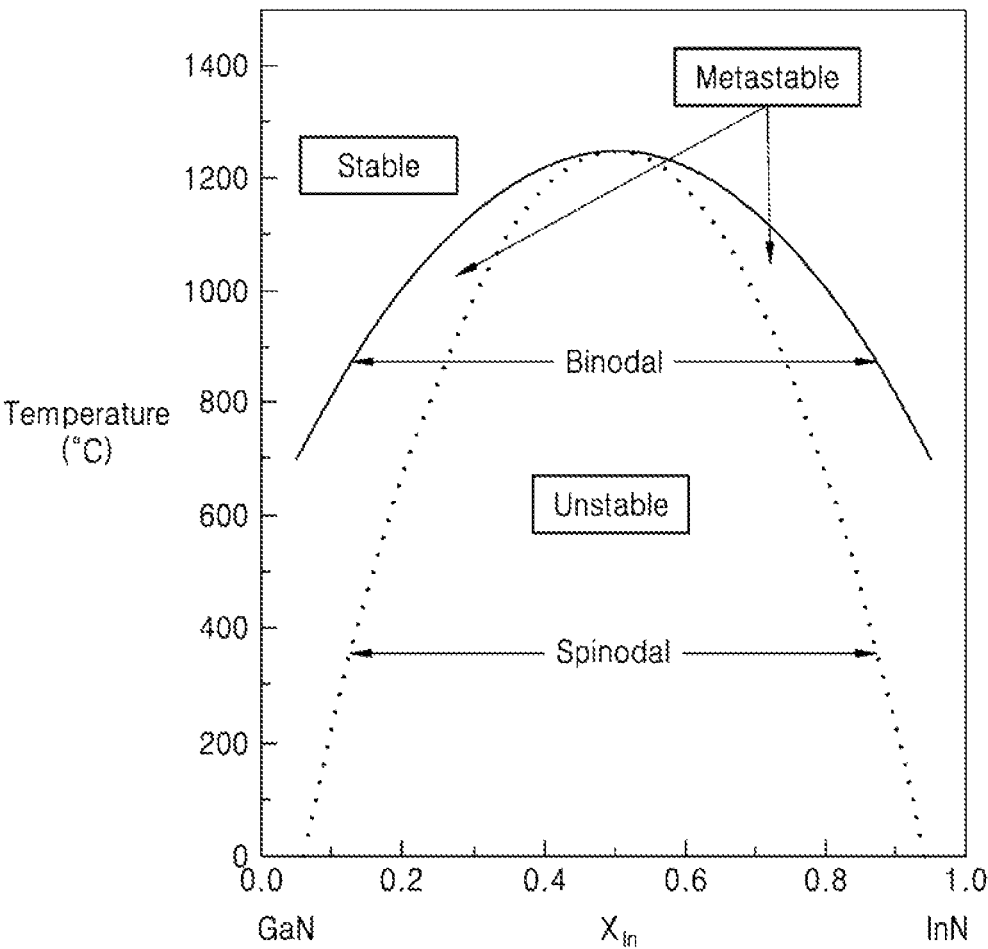
FIG. 4 is a diagram showing a phase separation state according to an indium content in a nitride semiconductor.
Figure 5:
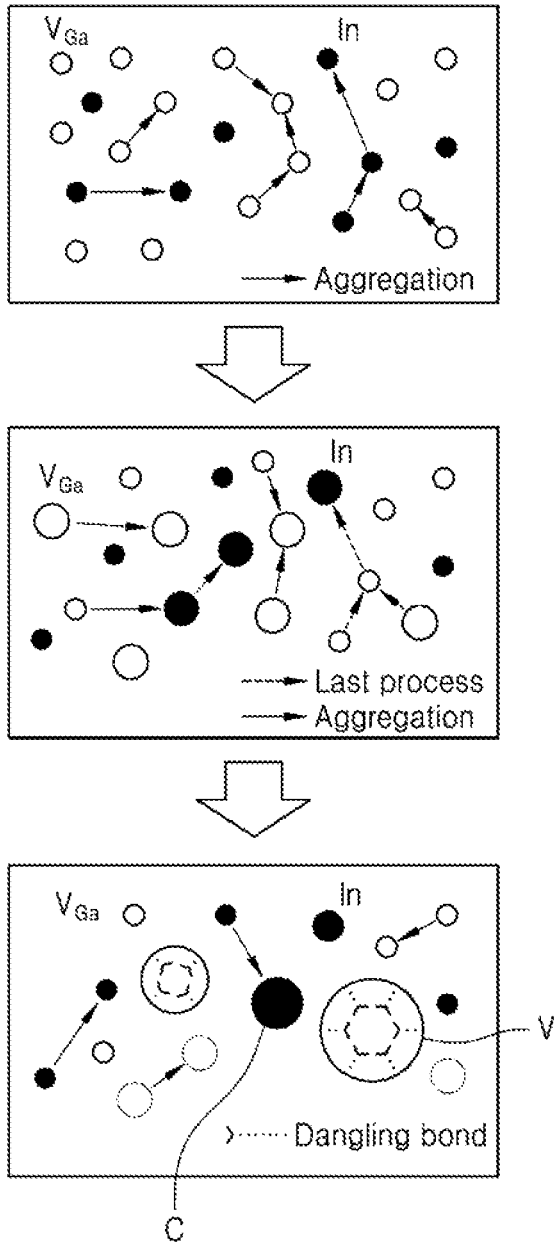
FIG. 5 is a diagram illustrating a process of formation of a plurality of indium clusters and a plurality of voids in a nitride semiconductor layer.

FIG. 4 is a diagram showing a phase separation state according to an indium content in a nitride semiconductor, and FIG. 5 is a diagram illustrating a process of formation of the plurality of indium clusters C and the plurality of voids V in a nitride semiconductor layer. As illustrated in FIG. 4, $In_xGa_{1-x}N$ (0<x<1) may be in at least one state of a spinodal state, a metastable state, and a binodal state, according to an indium content and a temperature. During the growth and heat treatment of $In_xGa_{1-x}N$ (0<x<1), in general, $In_xGa_{1-x}N$ (0<x<1) is in the spinodal state, which is an unstable state, and accordingly, the indium atoms of $In_xGa_{1-x}N$ (0<x<1) may be easily separated from $In_xGa_{1-x}N$ (0<x<1).

As illustrated in FIG. 5, the indium atoms included in $In_xGa_{1-x}N$ (0<x<1) may be separated from $In_xGa_{1-x}N$ (0<x<1), and the separated indium atoms may be bonded to each other to form indium clusters. As the indium atoms are separated from $In_xGa_{1-x}N$ (0<x<1), $In_xGa_{1-x}N$ (0<x<1) may become $In_{x-y}Ga_{1-x}N$ (0<y<x<1). Furthermore, $In_{x-y}Ga_{1-x}N$ (0<y<x<1) may enter a dangling bond state due to the separation of indium atoms, and other adjacent materials may be bonded to each other to form the plurality of voids V.

By sequentially growing the active layer 130 and the second semiconductor layer 120 on the strain relaxing layer 140, a semiconductor structure may be formed (S230). The active layer 130 may include III-V group semiconductors, for example, InGaN, GaN, AlGaN, AlInGaN, etc. The active layer 130 may have an MQW structure, or an SQW structure.

The second semiconductor layer 120 may include III-V group p-type semiconductors, for example, p-GaN. The second semiconductor layer 120 may have a single-layer structure or a multi-layer structure. For example, the second semiconductor layer 120 may include at least one semiconductor material of InAlGaN, GaN, AlGaN, InGaN, AlN, and InN, and may be a semiconductor layer doped with a conductive dopant such as Mg, etc.

The active layer 130 and the second semiconductor layer 120 may be formed by using various methods, including MOCVD, CVD, PECVD, MBE, HVPE, etc.

A plurality of light emitting devices 100 may be obtained by separating or dividing the semiconductor structure (S240). For example, a mask may be arranged on and apart from the second semiconductor layer 120. A width of the mask may determine a width of the light emitting device 100, and the width of the mask may be, for example, less than or equal to about 1 μm. In the semiconductor structure, by etching and removing a material in an area not overlapping the mask, the plurality of light emitting devices 100 may be obtained.

Figure 6:
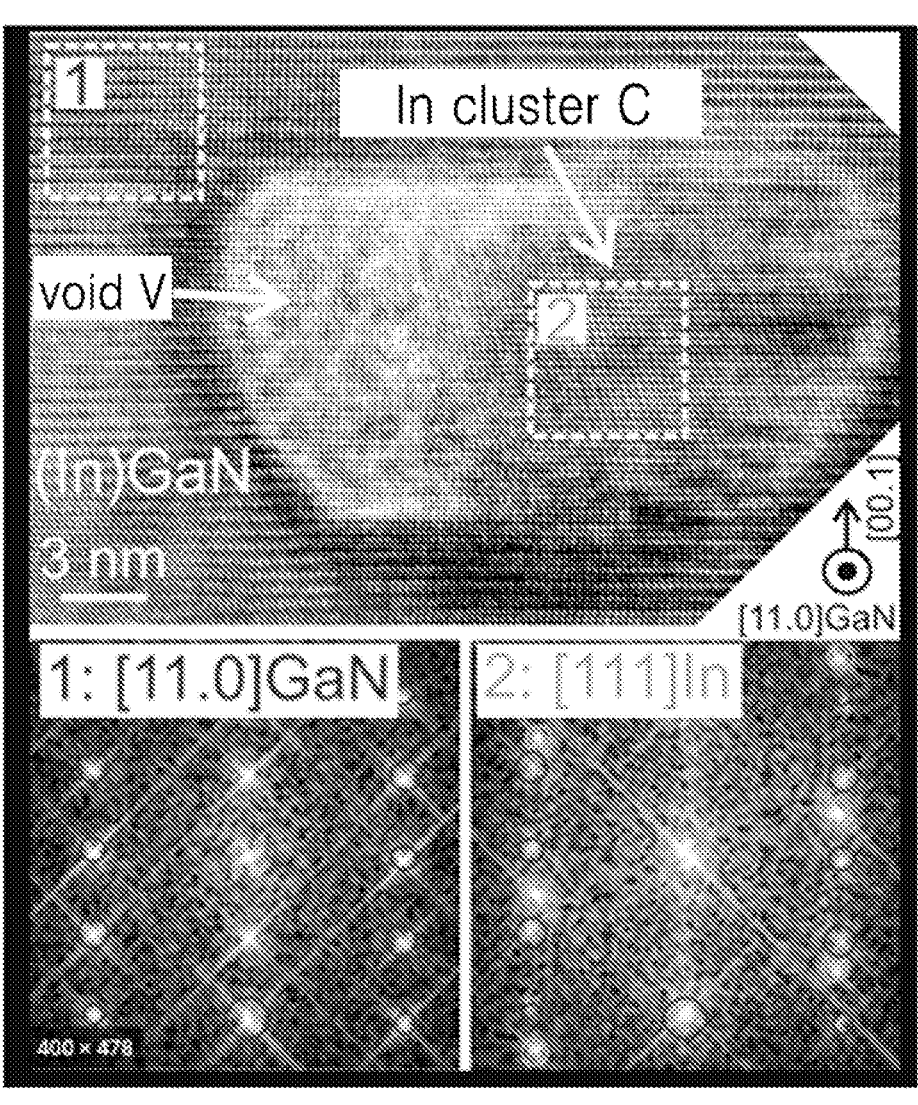
FIG. 6 is an atomic force microphotograph of a strain relaxing layer according to an embodiment.

FIG. 6 is an atomic force microphotograph of the strain relaxing layer 140 according to an embodiment. $In_{0.2}Ga_{0.8}N$ is grown on GaN at 400° C., and heat-treated for 30 minutes at 600° C. As a result of the heat treatment, the plurality of indium clusters C and the plurality of voids V are formed in the material.

Figure 7:
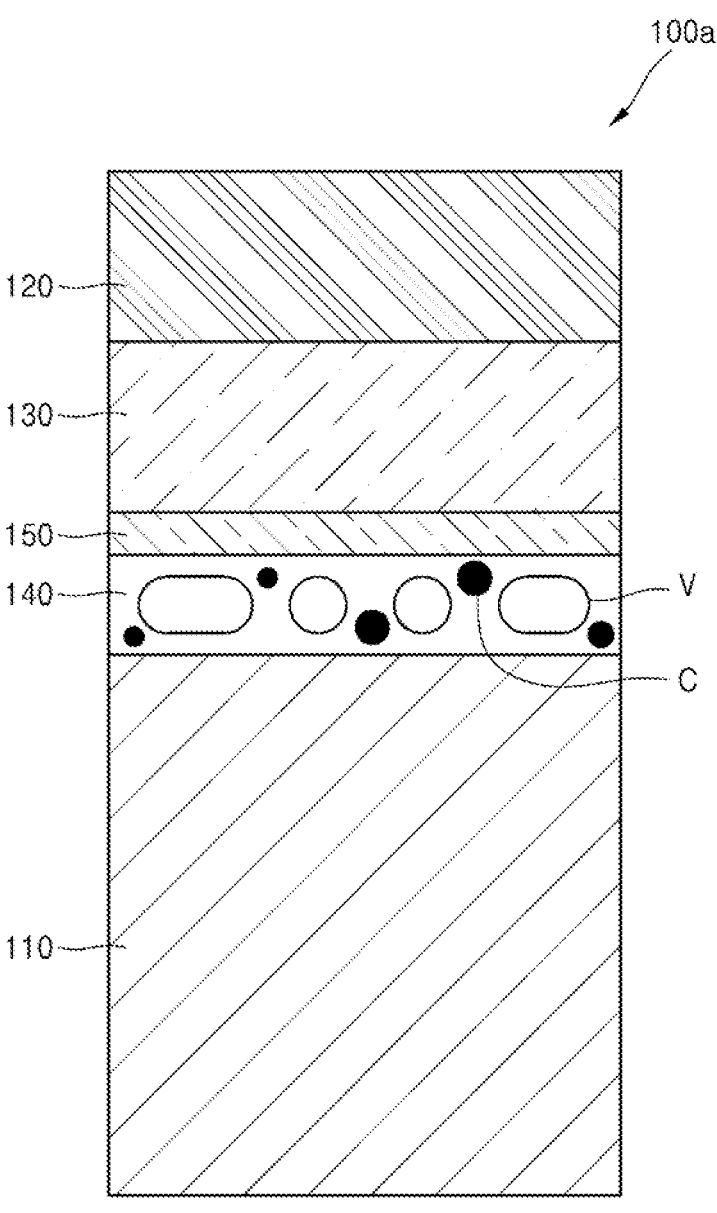
FIG. 7 is a diagram illustrating a light emitting device according to an embodiment.

FIG. 7 is a diagram illustrating a light emitting device 100a according to an embodiment. When comparing FIG. 1 to FIG. 7, the light emitting device 100a of FIG. 7 may further include a planarization layer 150 between the strain relaxing layer 140 and the active layer 130. As the strain relaxing layer 140 includes the plurality of indium clusters C and the plurality of voids V, an upper surface of the strain relaxing layer 140 may be irregular. The planarization layer 150 may planarize the upper surface of the strain relaxing layer 140 to facilitate the growth of the active layer 130.

The planarization layer 150 may be a semiconductor material. For example, the planarization layer 150 may include III-V group semiconductors materials. The planarization layer 150 may be a semiconductor material not including indium. For example, the planarization layer 150 may include AlGaN, AlN, etc. However, the disclosure is not limited thereto. The planarization layer 150 may include AlInGaN when the indium content is low or no heat treatment is performed during the manufacturing process.

As the planarization layer 150 is arranged between the strain relaxing layer 140 and the active layer 130, the relaxing of strain may be diminished due to the planarization layer 150, and current flow between the first semiconductor layer 110 and the second semiconductor layer 120 may be interrupted. Accordingly, to prevent such diminishment of the strain relaxing and interruption of current flow, the planarization layer 150 may have a thickness less than that of the strain relaxing layer 140. For example, the thickness of the planarization layer 150 may be less than or equal to about 1 μm. The thickness of the planarization layer 150 may be less than or equal to 50 nm.

Figure 8:
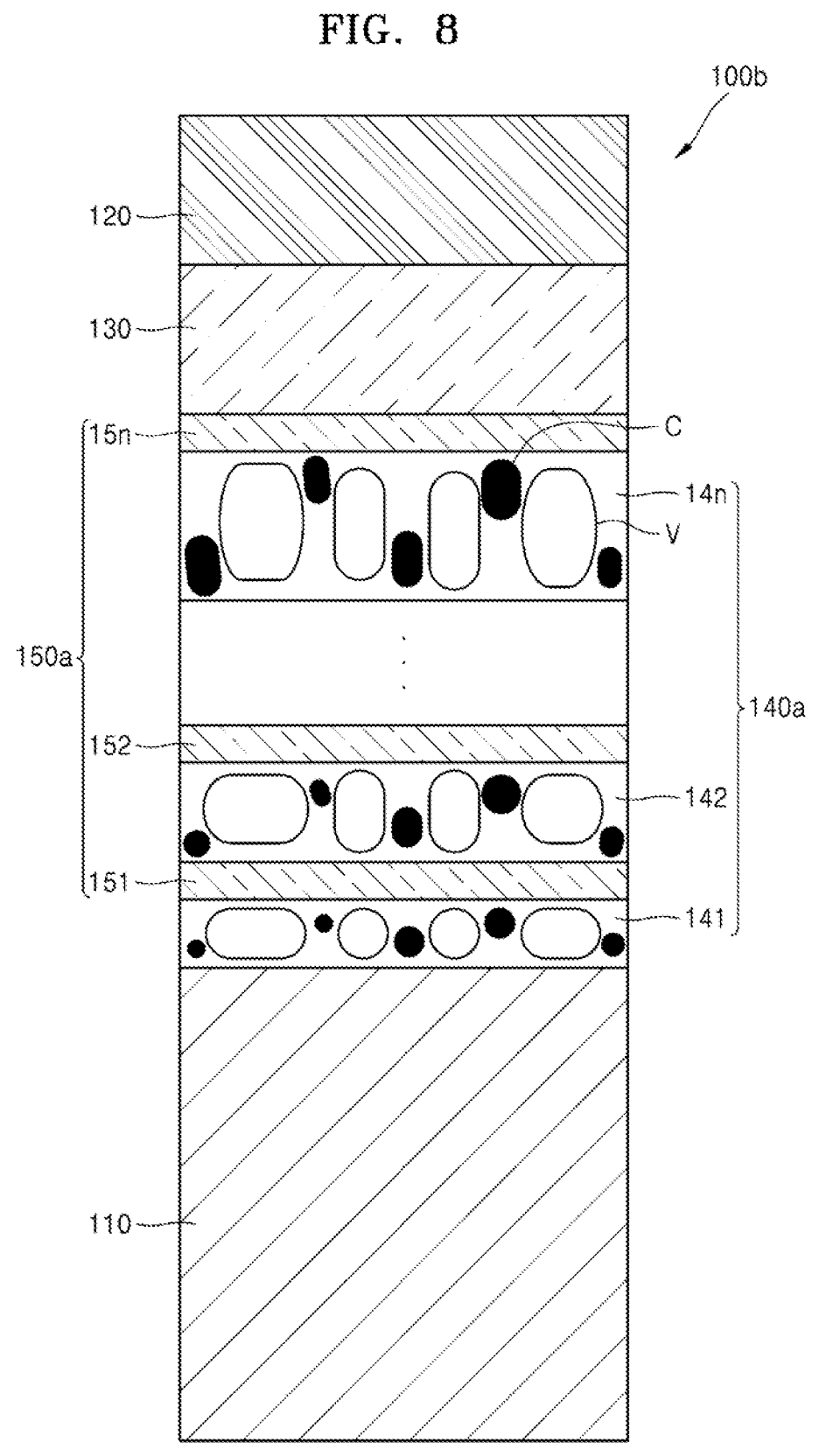

FIG. 8 is a diagram illustrating a light emitting device 100b including a plurality of layers between the first semiconductor layer 110 and the active layer 130 according to an embodiment. As illustrated in FIG. 8, the light emitting device 100b may include a plurality of strain relaxing layers 140a and a plurality of planarization layers 150a. The plurality of strain relaxing layers 140a and the plurality of planarization layers 150a may be arranged alternately on the first semiconductor layer 110 in a direction toward the active layer 130 (e.g., in a length direction of the light emitting device 100b). When growing each one of the strain relaxing layers (141, 142, 14n), the heat treatment may be repetitively performed. However, the disclosure is not limited thereto. As another example, after alternately growing the plurality of strain relaxing layers 140a and the plurality of planarization layers 150a, the heat treatment may be performed a single time.

As the light emitting device 100b includes the plurality of strain relaxing layers 140a, the strain between the first semiconductor layer 110 and the active layer 130 may be more effectively relaxed.

The plurality of strain relaxing layers 140a may have the same or different thickness. An average size of the plurality of indium clusters C and the plurality of voids V included in the strain relaxing layer (141, 142, . . . , 14n) may have relation to a thickness of the strain relaxing layer 140. The greater a thickness of the strain relaxing layer (141, 142, . . . 14n) is, the greater the average size of the plurality of indium clusters C and the plurality of voids V included therein may be. For example, the plurality of strain relaxing layers 140 may include a first strain relaxing layer 141 having a first thickness and a second strain relaxing layer 142 having a second thickness that is greater than the first thickness. An average size of the plurality of voids V included in the second strain relaxing layer 142 may be greater than an average size of the plurality of voids V included in the first strain relaxing layer 141.

The strain relaxing layers 140a may have thicknesses which increase towards the active layer 130 from the first semiconductor layer 110. As the greater the thickness of the strain relaxing layer is, the greater the size of the plurality of voids V may be, the strain relaxing effect may be increased.

Figure 9:
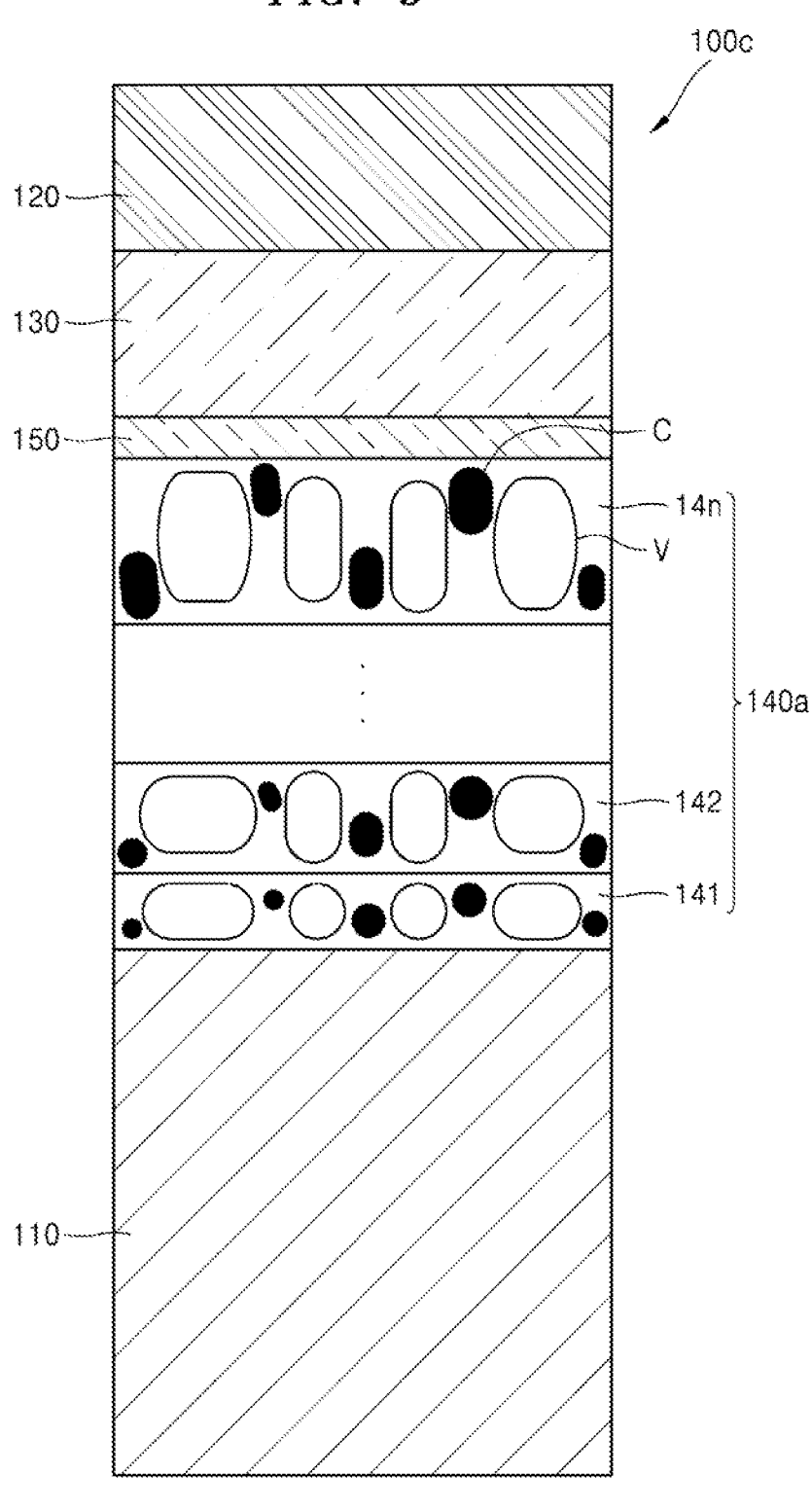
FIG. 9 is a diagram illustrating a light emitting device including a plurality of strain relaxing layers and one planarization layer according to an embodiment.

FIG. 9 is a diagram illustrating a light emitting device 100c including a plurality of strain relaxing layers 140a and one planarization layer 150 according to an embodiment. As illustrated in FIG. 9, the planarization layer 150 may be arranged on an upper surface of the strain relaxing layer 14n, which is the uppermost strain relaxing layer of the plurality of strain relaxing layers 140a. By arranging only one planarization layer 150, the strain relaxing effect may be prevented from being diminished.

Figure 10:
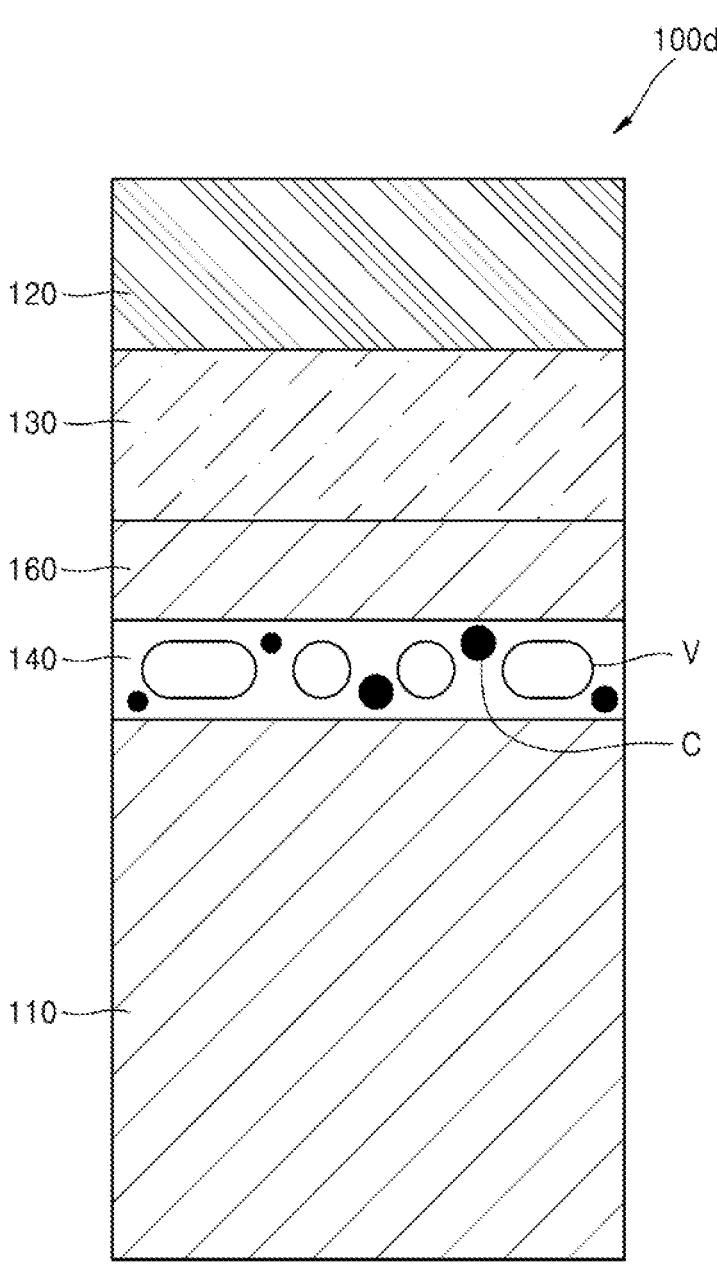
FIG. 10 is a diagram illustrating a light emitting device including a third semiconductor layer according to an embodiment.

FIG. 10 is a diagram illustrating a light emitting device 100d including a third semiconductor layer 160 according to an embodiment. When comparing FIG. 1 to FIG. 10, the light emitting device 100d of FIG. 10 may further include the third semiconductor layer 160 between the strain relaxing layer 140 and the active layer 130. The third semiconductor layer 160 and the first semiconductor layer 110 may be formed of the same semiconductor material. For example, the third semiconductor layer 160 may include an n-type semiconductor. The third semiconductor layer 160 may include, for example, GaN, AlGaN, etc., and may include a semiconductor layer doped with a conductive dopant, such as Si, Ge, Sn, etc.

The third semiconductor layer 160 may planarize a surface of the strain relaxing layer 140, and provide a carrier to the active layer 130. Accordingly, the third semiconductor layer 160 may be thicker than the planarization layer 150 described above. However, the third semiconductor layer 160 may prevent performance degradation of the light emitting device 100d that may be caused by the addition of the strain relaxing layer 140. In addition, when a distance between the strain relaxing layer 140 and the active layer 130 increases, the strain relaxing effect with respect to the active layer 130 may be diminished, and accordingly, the distance between the strain relaxing layer 140 and the active layer 130 may be less than or equal to about 5 μm. For example, a thickness of the third semiconductor layer 160 may be between about 1 μm and about 4 μm.

As the first semiconductor layer 110 and the third semiconductor layer 160 may be formed of the same material, an electric signal may be applied through the third semiconductor layer 160 so that the light emitting device 100d may emit light. For example, the electric signal may be applied through the first semiconductor layer 110 and the second semiconductor layer 120, the electric signal may be applied through the third semiconductor layer 160 and the second semiconductor layer 120, or the electric signal may be applied through all of the first semiconductor layer 110, the third semiconductor layer 160, and the second semiconductor layer 120.

Figure 11:
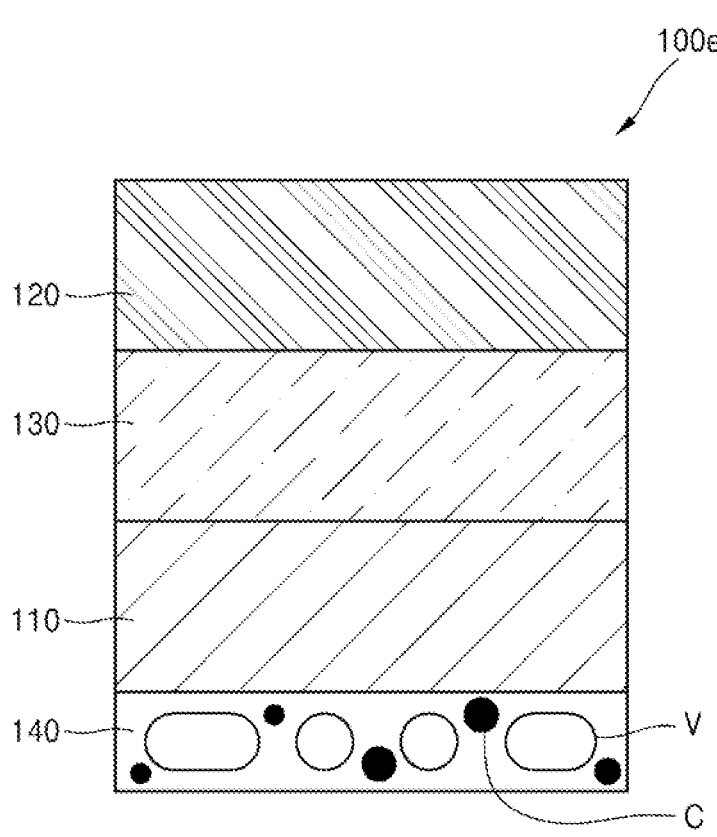
FIG. 11 is a diagram illustrating a light emitting device according to an embodiment.

FIG. 11 is a diagram illustrating a light emitting device 100e according to an embodiment. When comparing FIG. 1 to FIG. 11, the strain relaxing layer 140 of the light emitting device 100e of FIG. 11 may be spaced apart from the active layer 130 with the first semiconductor layer 110 therebetween. A thickness of the first semiconductor layer 110 may be less than or equal to 5 μm. For example, the thickness of the first semiconductor layer 110 may be less than or equal to about 1 μm to about 4 μm.

Figure 12:
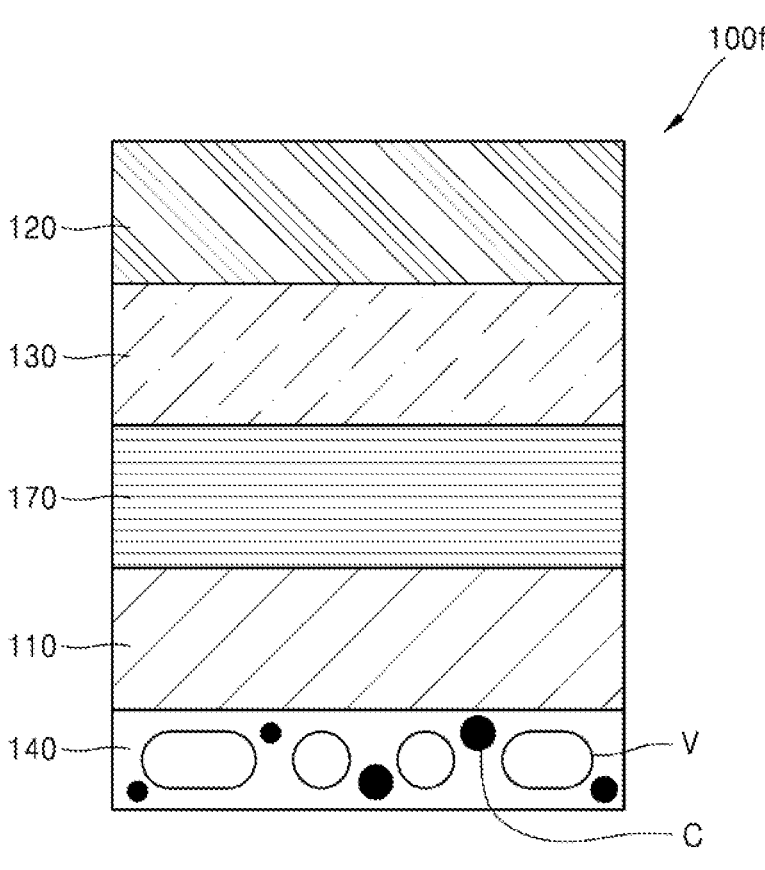
FIG. 12 is a diagram illustrating a light emitting device including a superlattice layer according to an embodiment.

FIG. 12 is a diagram illustrating a light emitting device 100f including a superlattice layer 170 according to an embodiment. When comparing FIG. 11 to FIG. 12, the light emitting device 100f of FIG. 12 may further include the superlattice layer 170. The superlattice layer 170 may be arranged between the first semiconductor layer 110 and the active layer 130.

The superlattice layer 170 may be a layer in which a plurality of layers having different bandgap energies are alternately and repetitively stacked. For example, the superlattice layer 170 may be formed by alternately stacking an InGaN layer with a GaN layer. The superlattice layer 170 may further include aluminum, and may be doped with an n-type dopant.

The superlattice layer 170 may secure crystallinity of the active layer 130 prior to the growth of the active layer 130, and additionally adjust the strain between the first semiconductor layer 110 and the active layer 130. In some cases, the superlattice layer 170 may be arranged below the first semiconductor layer 110.

In addition to the foregoing, the light emitting device may further include various numbers of cladding layers of different compositions.

Figure 13:
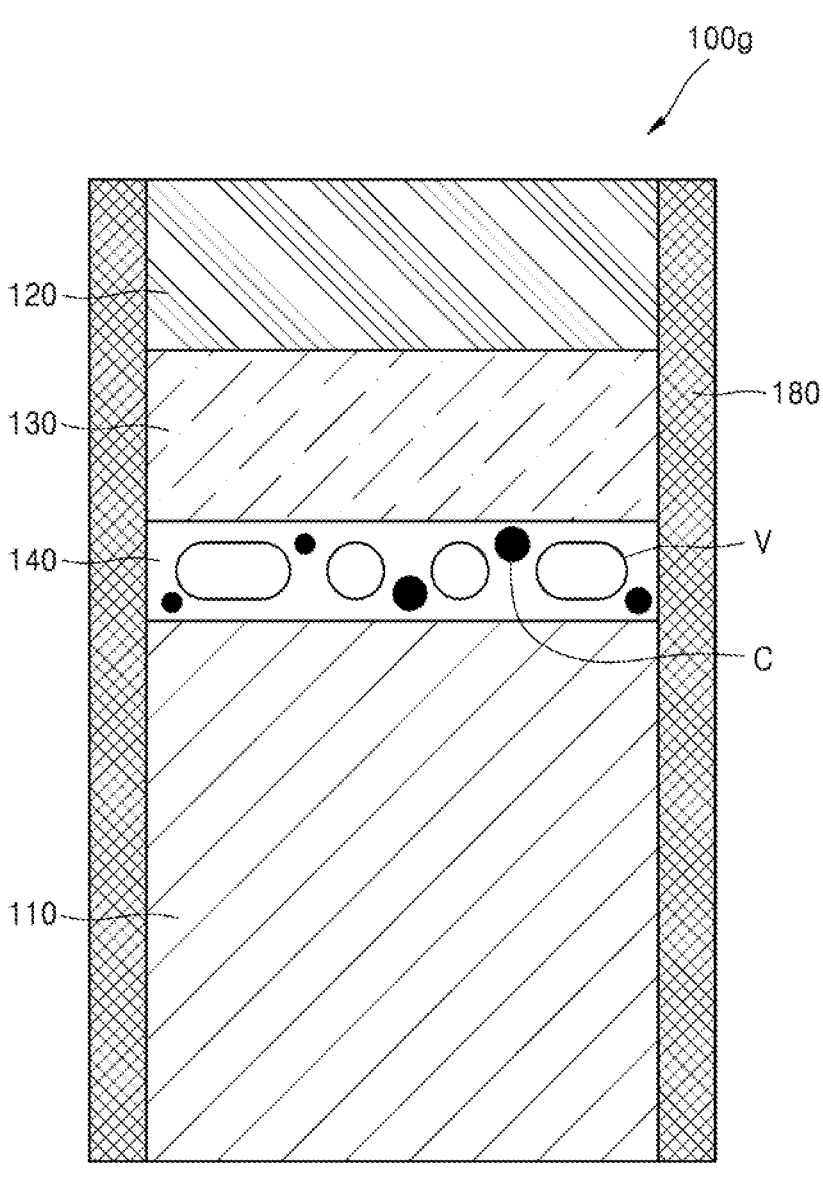
FIG. 13 is a diagram illustrating a light emitting device including an insulating film according to an embodiment.

FIG. 13 is a diagram illustrating a light emitting device 100g further including an insulating film 180 according to an embodiment. When comparing FIG. 1 to FIG. 13, the light emitting device 100g of FIG. 12 may further include the insulating film 180. The insulating film 180 may be provided to partially cover a main body of the light emitting device 100g (e.g., the first semiconductor layer 110, the strain relaxing layer 140, the active layer 130, and the second semiconductor layer 120). For example, the insulating film 180 may be provided to partially cover at least some of outer circumference surfaces of the first semiconductor layer 110, the strain relaxing layer 140, the active layer 130, and/or the second semiconductor layer 120, thereby exposing both ends of the light emitting device 100g. For example, the insulating film 180 may be provided to partially cover at least an outer circumferential surface of the active layer 130.

The insulating film 180 may include a transparent insulator. For example, the insulating film 180 may include one or more insulators selected from the group consisting of $SiO_2$, $Si_3N_4$, $Al_2O_3$, and $TiO_2$; however, the disclosure is not limited thereto, and various materials with insulating properties may be used.

When the insulating film 180 is provided in the light emitting device 100f, a short circuit between the active layer 130 and a first electrode and/or a second electrode may be prevented.

Furthermore, by forming the insulating film 180, surface defects of the light emitting device 100g may be minimized, which leads to improved lifespan and efficiency. Moreover, when a plurality of light emitting devices are arranged close to each other, the insulating film 180 may prevent undesired short circuit among the plurality of light emitting devices.

Figure 14:
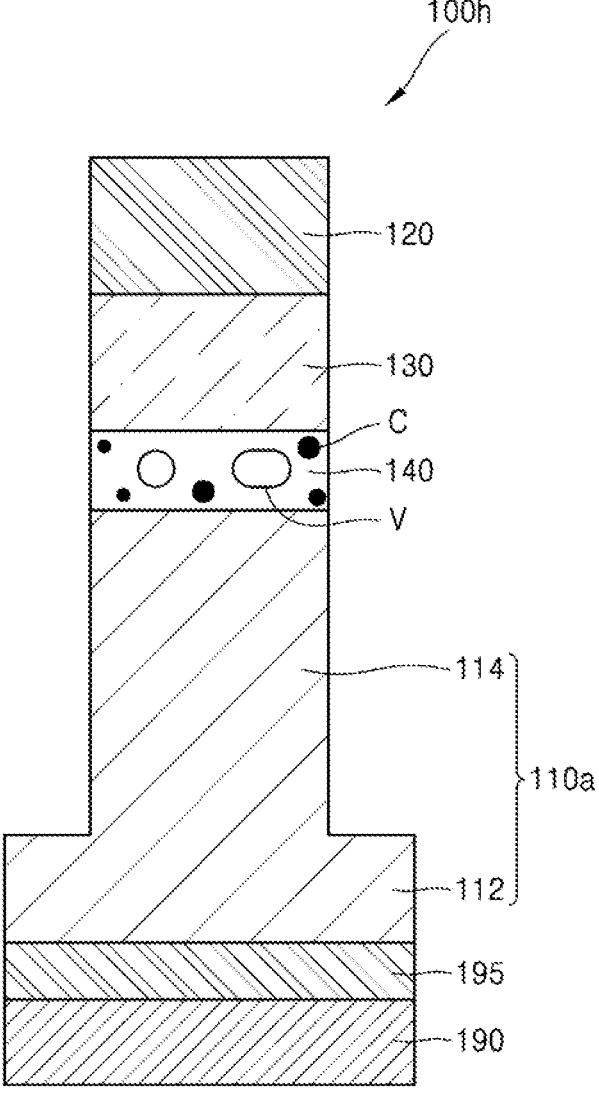
FIG. 14 is a diagram illustrating a light emitting device including a substrate and a buffer layer according to an embodiment.

FIG. 14 is a diagram illustrating a light emitting device 100h including a substrate and a buffer layer according to an embodiment. When compared to FIG. 1, the light emitting device 100h of FIG. 14 may further include a substrate 190 supporting both the main body (e.g., a first semiconductor layer 110a, the active layer 130, and the second semiconductor layer 120) of the light emitting device and a buffer layer 195.

The substrate 190 may be a substrate for growth of semiconductors, and may be a dissimilar substrate to a nitride-based semiconductor layer. For example, the substrate 190 may be sapphire, and in such case, the substrate 190 may be stable at high temperatures and facilitate growth of nitride thin film thereon. In addition to the foregoing, the substrate 190 may use SiC, $MgAl_2O_4$, MgO, $LiAlO_2$, $LiGaO_2$, GaN, etc.

The buffer layer 195 may be a layer to improve crystallinity of the semiconductor layers formed thereon (e.g., the first semiconductor layer 110a, the strain relaxing layer 140, the active layer 130, and the second semiconductor layer 120). The buffer layer 195 may include, for example, aluminum gallium nitride ($Al_xGa_{1-x}N$, $0<x\leq1$) grown without doping.

The first semiconductor layer 110a may be arranged on the buffer layer 195. The first semiconductor layer 110a may include a first area 112 having a width identical to a width of the buffer layer 195, and a second area 114 having a width narrower than the width of the buffer layer 195. The second area 114 may be formed on the first area 112. That is, the first semiconductor layer 110a may have a shape in which a portion of an upper surface protrudes.

A carrier concentration of the first semiconductor layer 110a may increase towards the active layer 130 from the buffer layer 195. The higher the carrier concentration is, the lower a resistance of the first semiconductor layer 110a may be. In particular, the second area 114 of the first semiconductor layer 110a adjacent to the active layer 130 has a width narrower than that of the first area 112 of the first semiconductor layer 110a adjacent to the buffer layer 195, and accordingly, may have a higher carrier concentration. This may enhance the efficiency of the light emitting device 100h.

The light emitting devices (100, 100a, 100b, 100c, 100d, 100e, 100f, 100g, and 100h) described above may be used as a light emitting source of various display apparatuses. For example, the light emitting devices (100, 100a, 100b, 100c, 100d, 100e, 100f, 100g, and 100h) may be applied to a lighting system or a spontaneous display apparatus.

Figure 15:
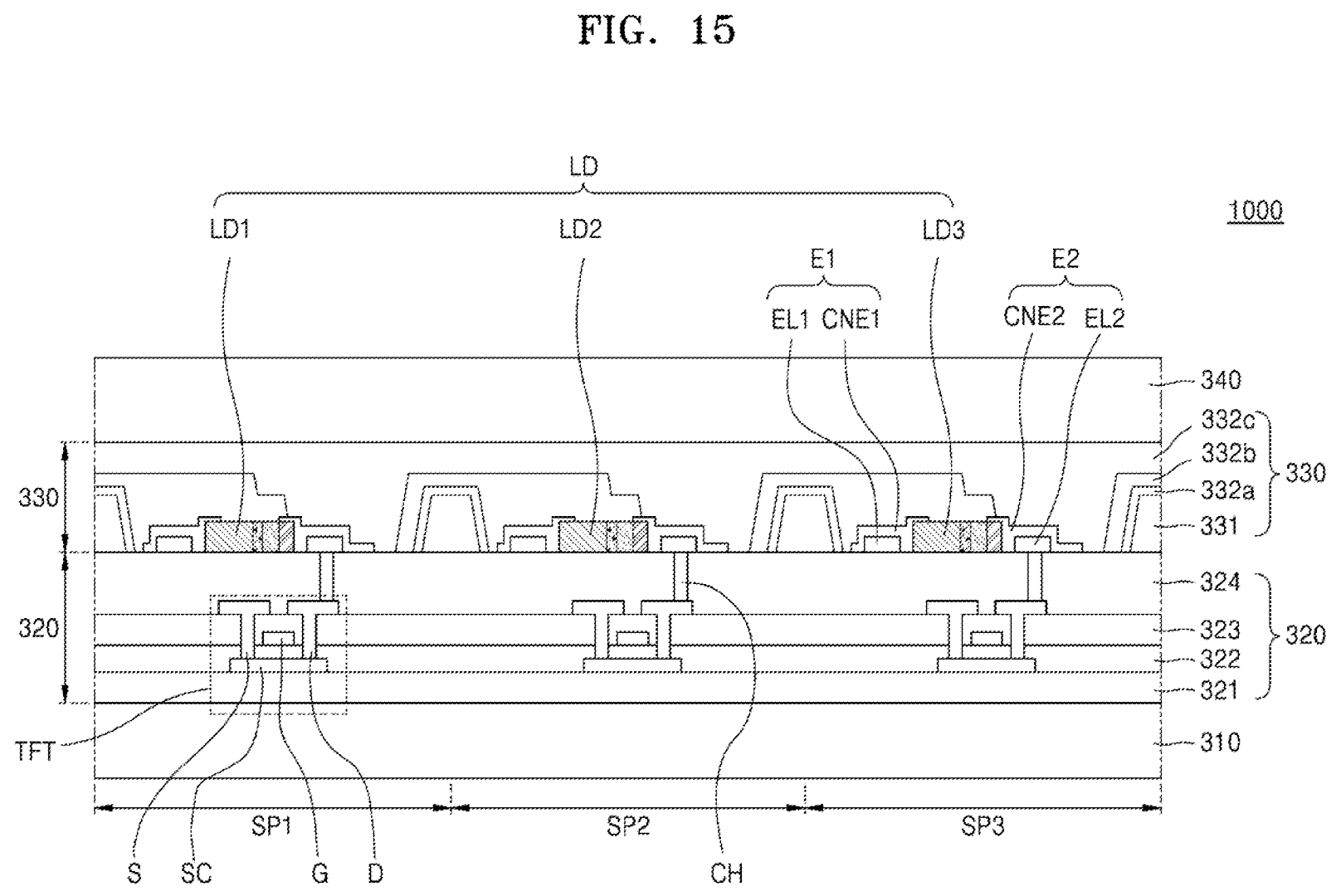

FIG. 15 is a diagram illustrating a part of a display apparatus including a nitride semiconductor layer according to an embodiment. With reference to FIG. 15, a display apparatus 1000 may include a substrate 310 including a plurality of pixels. One pixel may include a first subpixel SP1, a second subpixel SP2, and a third subpixel SP3 provided on the substrate 310.

The first to third subpixels SP1, SP2, and SP3 may be a pixel area displaying an image in one pixel, and a light emitting area from which light is output.

Each of the first to third subpixels SP1, SP2, and SP3 may include the substrate 310, a driving device layer 320, a display device layer 330, and a cover structure layer 340.

The substrate 310 may include an insulator, such as glass, organic polymer, crystal, etc. Furthermore, the substrate 310 may include a material with flexibility so that the substrate 310 may be bent or folded, and may have a single-layer structure or a multi-layer structure.

The driving device layer 320 may include a buffer layer 321 arranged on the substrate 310, a transistor TFT arranged on the buffer layer 321, and a driving power wire.

The buffer layer 321 may prevent impurity diffusion in the transistor TFT. The buffer layer 321 may be provided as a single-layer, or as a multi-layer having at least two layers. When the buffer layer 321 is provided as a multi-layer, each layer may be formed of the same or different material. The buffer layer 321 may be omitted depending on a material or process conditions of the substrate 310.

The transistor TFT may drive a corresponding light emitting device among a plurality of light emitting devices (LD1, LD2, and LD3) included in the display device layer 330. The transistor TFT may include a semiconductor layer SC, a gate electrode G, a source electrode S, and a drain electrode D.

The semiconductor layer SC may be arranged on the buffer layer 321. The semiconductor layer SC may include a source region in contact with the source electrode S, and a drain region in contact with the drain electrode D. A region between the source region and the drain region may be a channel region.

The semiconductor layer SC may be a semiconductor pattern including polysilicon, amorphous silicon, oxide semiconductor, etc. The channel region may be a semiconductor pattern undoped with impurities, e.g., an intrinsic semiconductor. The source region and the drain region may be semiconductor patterns doped with impurities.

The gate electrode G may be provided on the semiconductor layer SC with a gate insulating layer therebetween.

Each of the source electrode S and the drain electrode D may be in contact with the source region and the drain region of the semiconductor layer SC through a contact hole penetrating an interlayer insulting layer 323 and the gate insulating layer 322.

A protective layer 324 may be provided on the transistor TFT.

The display device layer 330 may include the plurality of light emitting devices (LD1, LD2, and LD3) provided on the protective layer 324. The light emitting device LD1 arranged at the first subpixel SP1 may emit red light, the light emitting device LD2 arranged at the second subpixel SP2 may emit green light, and the light emitting device LD3 arranged at the third subpixel SP3 may emit blue light. For example, the light emitting device LD1 (e.g., a first light emitting device) arranged at the first subpixel SP1 may emit light having a wavelength of about 620 nm to about 750 nm, the light emitting device LD2 (e.g., a second light emitting device) arranged at the second subpixel SP2 may emit light having a wavelength of about 495 nm to about 570 nm, and the light emitting device LD3 (e.g., a third light emitting device) arranged at the third subpixel SP3 may emit light having a wavelength of about 420 nm to about 495 nm. However, the disclosure is not limited thereto. At least one of the plurality of light emitting devices (LD1, LD2, and LD3) may emit light having a wavelength of about 380 nm to about 450 nm, light having a wavelength of about 570 nm to about 590 nm, or light having a wavelength of about 590 nm to about 620 nm. In a process of manufacturing the light emitting devices (LD1, LD2, and LD3), by adjusting the indium content, a wavelength of emitted light may be changed.

In the drawings, the light emitting device 100 in FIG. 1 is illustrated as the light emitting devices (LD1, LD2, and LD3). However, the disclosure is not limited thereto. At least one of the light emitting devices (LD1, LD2, and LD3) respectively provided at the first to third subpixels SP1, SP2, and SP3 may have the structure of any of the light emitting devices (100, 100a, 100b, 100c, 100d, 100e, 100f, 100g, and 100h).

The display device layer 330 may further include a pixel definition layer 331. The pixel definition layer 331 may be provided on the protective layer 324, and divide the light emitting area in each of the first to third subpixels SP1, SP2, and SP3. The pixel definition layer 331 may include an opening exposing the light emitting devices (LD1, LD2, and LD3) respectively included in the first to third subpixels SP1, SP2, and SP3.

Two adjacent pixel definition layers 331 may be spaced apart from each other at a certain distance on the substrate 310. For example, the two adjacent pixel definition layers 331 may be spaced apart from each other at a distance greater than or equal to a length of the light emitting devices (LD1, LD2, and LD3) on the substrate 310. The pixel definition layer 331 may be an insulator including an inorganic material or an organic material; however, the disclosure is not limited thereto.

The pixel definition layer 331 may be an insulator including an organic material. For example, the pixel definition layer 331 may include polystyrene, polymethylmethacrylate (PMMA), polyacrylonitrile (PAN), polyamide (PA), polyimide (PI), polyarylether (PAE), heterocyclic polymer, parylene, epoxy, benzocyclobutene (BCB), siloxane-based resin, silane-based resin, etc.

A first insulating layer 332a may be provided on the pixel definition layer 331. The first insulating layer 332a may partially cover an upper surface of each of the light emitting devices (LD1, LD2, and LD3) respectively provided at the first to third subpixels SP1, SP2, and SP3. By the first insulating layer 332a, a first end and a second end of each of the light emitting devices (LD1, LD2, and LD3) may be exposed to the outside.

A first electrode E1 and a second electrode E2 may be arranged on the protective layer 324. The first electrode E1 may include a first subelectrode EL1 arranged adjacent to one end of a corresponding light emitting device LD (e.g., the end corresponding to the first semiconductor layer 110), and a first contact electrode CNE1 electrically connecting the first subelectrode EL1 to the one end of the light emitting device LD. The second electrode E2 may include a second subelectrode EL2 arranged adjacent to another end of a corresponding light emitting device LD (e.g., the end corresponding to the second semiconductor layer 120), and a second contact electrode CNE2 electrically connecting the second subelectrode EL2 to the other end of the light emitting device LD.

Accordingly, a driving voltage may be applied to a corresponding light emitting device LD through the first electrode E1, and a voltage of the transistor TFT may be applied to a corresponding light emitting device LD through the second electrode E2. As a result, as certain voltages are applied to both ends of the light emitting device LD through the first electrode E1 and the second electrode E2, the light emitting device LD may emit light. A wavelength of emitted light may vary according to an indium content of the light emitting device.

A second insulating layer 332b and a third insulating layer 332c may be provided on the first and second electrodes E1 and E2.

An overcoat layer 340 may be provided on the third insulating layer 332c. The overcoat layer 340 may be the planarization layer 150 to relieve a step generated by the components arranged thereunder (e.g., to planarize a surface of the display apparatus 1000). Furthermore, the overcoat layer 340 may be an encapsulating layer to prevent penetration of water or oxygen into the light emitting device.

In addition, when the light emitting devices (LD1, LD2, and LD3) of the first to third subpixels SP1, SP2, and SP3 emit light having the same wavelength, the display apparatus may further include a color conversion layer. The color conversion layer may include a first color conversion pattern, a second color conversion pattern, and a third color conversion pattern. Here, each of the first to third color conversion patterns may correspond to each subpixel. For example, the first color conversion pattern may correspond to the first subpixel SP1, the second color conversion pattern may correspond to the second subpixel SP2, and the third color conversion pattern may correspond to the third subpixel SP3.

Figure 16:
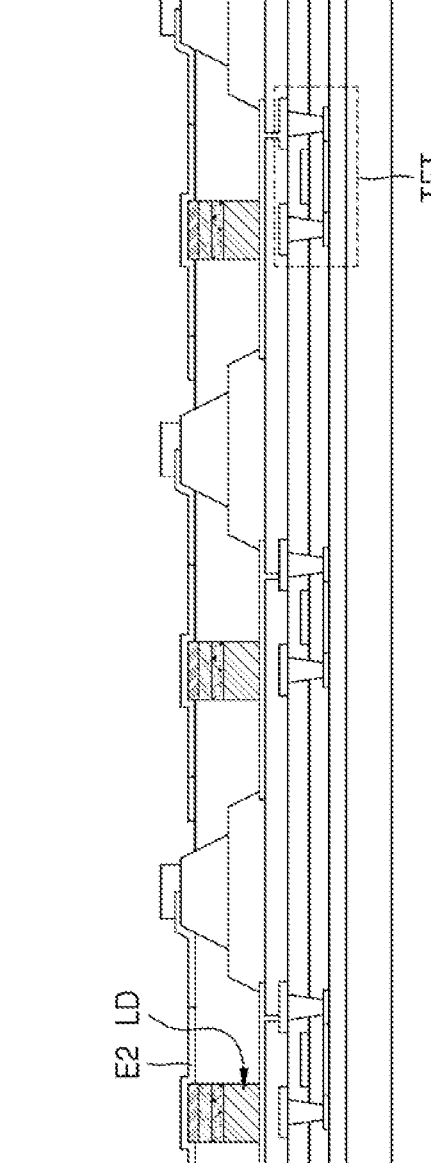
FIG. 16 is a diagram illustrating a part of a display apparatus according to an embodiment.

FIG. 16 is a diagram illustrating a part of a display apparatus according to an embodiment. When comparing FIG. 15 to FIG. 16, the first semiconductor layer, the active layer, and the second semiconductor layer of the light emitting device LD of FIG. 16 may be arranged in order in a thickness direction of the substrate 310.

Figure 17:
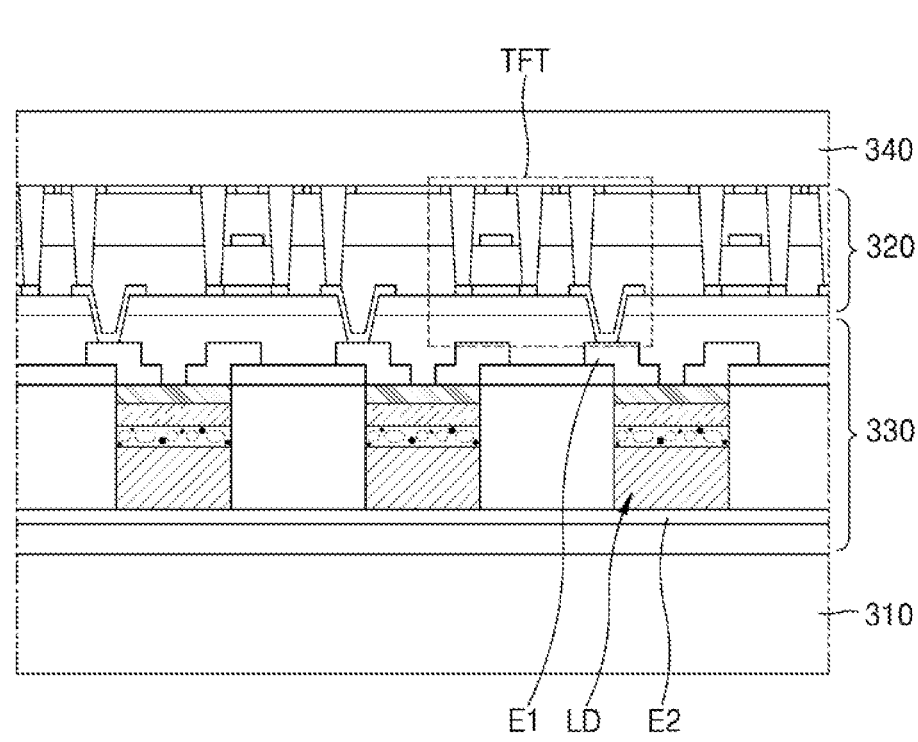
FIG. 17 is a diagram illustrating a part of a display apparatus according to an embodiment.

FIG. 17 is a diagram illustrating a part of a display apparatus according to an embodiment. As illustrated in FIG. 17, the display device layer 330, the driving device layer 320, and the overcoat layer 340 may be arranged in order on the substrate 310. When comparing FIG. 16 to FIG. 17, the display device layer 330 may be arranged between the substrate 310 and the driving device layer 320. The display apparatus of FIG. 17 may be implemented as a bottom emission type as each of the light emitting devices LD emits light of different wavelengths.

Figure 18:
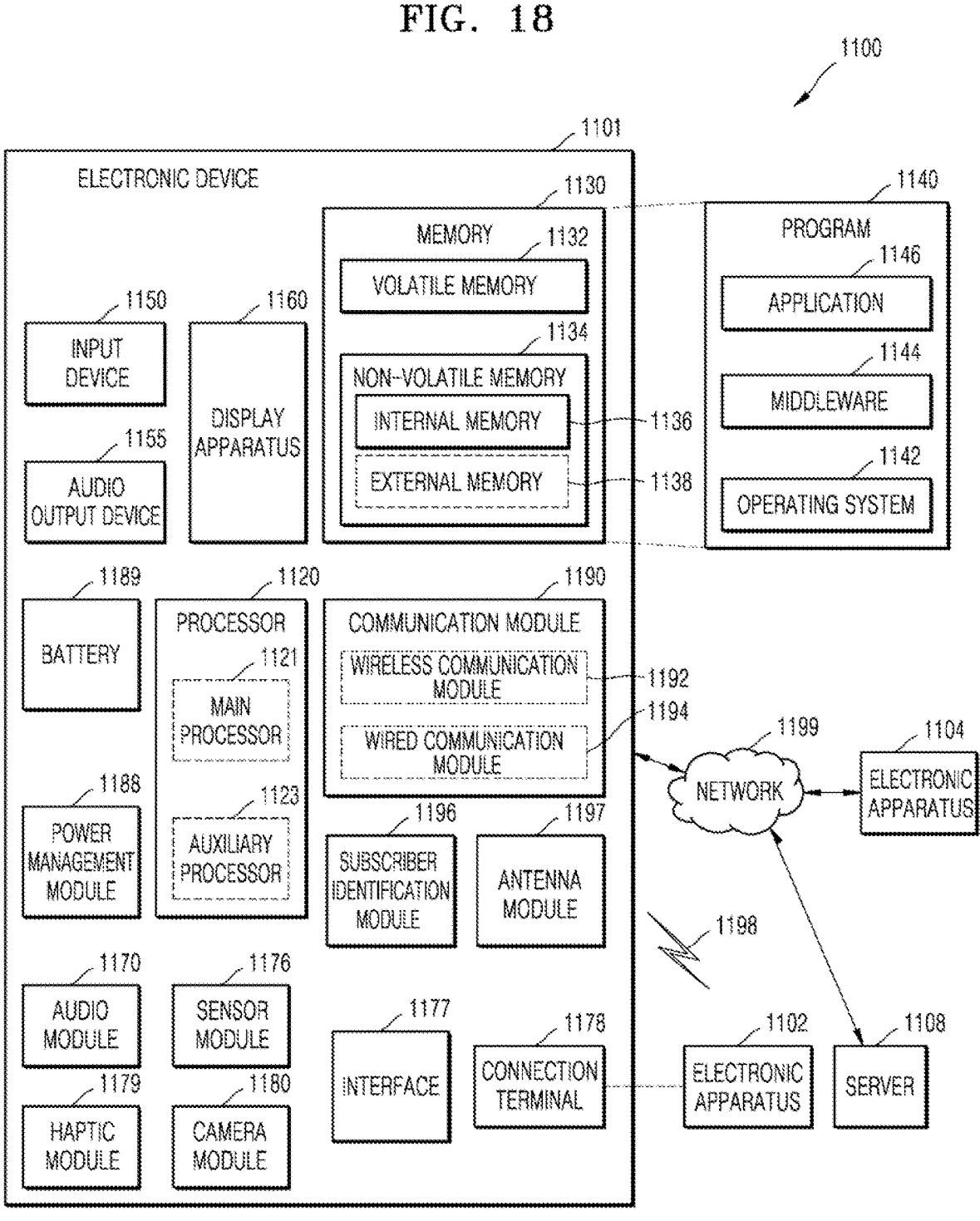
FIG. 18 is a schematic block diagram of an electronic apparatus according to an embodiment.

The display apparatuses described above may be applied to various electronic apparatuses having a display function. FIG. 18 is a schematic block diagram of an electronic apparatus according to an embodiment. With reference to FIG. 18, an electronic apparatus 1101 may be provided in a network environment 1100. In the network environment 1100, the electronic apparatus 1101 may communicate with another electronic apparatus 1102 through a first network 1198 (a short-range wireless communication network, etc.) or communicate with another electronic apparatus 1104 and/or a server 1108 through a second network 1199 (a long-distance wireless communication network, etc.). The electronic apparatus 1101 may communicate with the electronic apparatus 1104 through the server 1108. The electronic apparatus 1101 may include a processor 1120, a memory 1130, an input device 1150, an audio output device 1155, a display apparatus 1160, an audio module 1170, a sensor module 1176, an interface 1177, a haptic module 1179, a camera module 1180, a power management module 1188, a battery 1189, a communication module 1190, a subscriber identification module 1196, and/or an antenna module 1197. In the electronic apparatus 1101, some of constituent elements may be omitted or other constituent elements may be added. Some of the constituent elements may be implemented by one integrated circuit. For example, the sensor module 1176 (a fingerprint sensor, an iris sensor, an illuminance sensor, and the like) may be implemented by being embedded in the display apparatus 1160 (a display and the like).

The processor 1120 may control one or a plurality of other constituent elements (hardware and software constituent elements, and the like) of the electronic apparatus 1101 connected to the processor 1120 by executing software (a program 1140 and the like), and perform various data processing or calculations. As part of the data processing or calculations, the processor 1120 may load, in a volatile memory 1132, commands and/or data received from other constituent elements (the sensor module 1176, the communication module 1190, and the like), process the command and/or data stored in the volatile memory 1132, and store result data in a non-volatile memory 1134. The non-volatile memory 1134 may include an internal memory 1136 fixedly installed in the electronic apparatus 1101 and an external memory 1138 that is removable. The processor 1120 may include a main processor 1121 (a central processing unit, an application processor, and the like) and an auxiliary processor 1123 (a graphics processing unit, an image signal processor, a sensor hub processor, a communication processor, and the like) that is operable independently of or together with the main processor 1121. The auxiliary processor 1123 may use less power than the main processor 1121 and may perform a specialized function.

Instead of the main processor 1121 when the main processor 1121 is in an inactive state (sleep state), or with the main processor 1121 when the main processor 1121 is in an active state (application execution state), the auxiliary processor 1123 may control functions and/or states related to some constituent elements (the display apparatus 1160, the sensor module 1176, the communication module 1190, and the like) of the constituent elements of the electronic apparatus 1101. The auxiliary processor 1123 (an image signal processor, a communication processor, and the like) may be implemented as a part of other functionally related constituent elements (the camera module 1180, the communication module 1190, and the like).

The memory 1130 may store a variety of data needed by the constituent elements (the processor 1120, the sensor module 1176, and the like) of the electronic apparatus 1101. The data may include, for example, software (the program 1140 and the like) and input data and/or output data about commands related thereto. The memory 1130 may include the volatile memory 1132 and/or the non-volatile memory 1134.

The program 1140 may be stored in the memory 1130 as software, and may include an operating system 1142, middleware 1144, and/or an application 1146.

The input device 1150 may receive instructions and/or data to be used for constituent elements (the processor 1120 and the like) of the electronic apparatus 1101, from the outside (a user and the like) of the electronic apparatus 1101. The input device 1150 may include a remote controller, a microphone, a mouse, a keyboard, and/or a digital pen (a stylus pen and the like).

The audio output device 1155 may output an audio signal to the outside of the electronic apparatus 1101. The audio output device 1155 may include a speaker and/or a receiver. The speaker may be used for general purposes such as multimedia playback or recording playback, and the receiver may be used to receive incoming calls. The receiver may be implemented by being coupled as a part of the speaker or by an independent separate device.

The display apparatus 1160 may visually provide information to the outside of the electronic apparatus 1101. The display apparatus 1160 may include a display, a hologram device, or a projector, and a control circuit to control a corresponding device. The display apparatus 1160 may include the driving circuit, the light emitting device 100, a lateral reflection structure, a lower reflection structure, etc. The display apparatus 1160 may further include touch circuitry set to detect a touch and/or a sensor circuit (a pressure sensor and the like) set to measure the strength of a force generated by the touch.

The audio module 1170 may convert sound into electrical signals or reversely electrical signals into sound. The audio module 1170 may obtain sound through the input device 1150, or output sound through a speaker and/or a headphone of another electronic apparatus (the electronic apparatus 1102 and the like) connected to the audio output device 1155 and/or the electronic apparatus 1101 in a wired or wireless manner.

The sensor module 1176 may detect an operation state (power, temperature, and the like) of the electronic apparatus 1101, or an external environment state (a user state, and the like), and generate an electrical signal and/or a data value corresponding to a detected state. The sensor module 1176 may include a gesture sensor, a gyro sensor, a barometric pressure sensor, a magnetic sensor, an acceleration sensor, a grip sensor, a proximity sensor, a color sensor, an IR sensor, a biometric sensor, a temperature sensor, a humidity sensor, and/or an illuminance sensor.

The interface 1177 may support one or more specified protocols used for the electronic apparatus 1101 to be connected to another electronic apparatus (the electronic apparatus 1102 and the like) in a wired or wireless manner. The interface 1177 may include a high definition multimedia interface (HDMI), a universal serial bus (USB) interface, an SD card interface, and/or an audio interface.

A connection terminal 1178 may include a connector for the electronic apparatus 1101 to be physically connected to another electronic apparatus (the electronic apparatus 1102 and the like). The connection terminal 1178 may include an HDMI connector, a USB connector, an SD card connector, and/or an audio connector (a headphone connector and the like).

The haptic module 1179 may convert electrical signals into mechanical stimuli (vibrations, movements, and the like) or electrical stimuli that are perceivable by a user through tactile or motor sensations. The haptic module 1179 may include a motor, a piezoelectric device, and/or an electrical stimulation device.

The camera module 1180 may capture a still image and a video. The camera module 1180 may include a lens assembly including one or more lenses, image sensors, image signal processors, and/or flashes. The lens assembly included in the camera module 1180 may collect light emitted from a subject for image capturing.

The power management module 1188 may manage power supplied to the electronic apparatus 1101. The power management module 1188 may be implemented as a part of a power management integrated circuit (PMIC).

The battery 1189 may supply power to the constituent elements of the electronic apparatus 1101. The battery 1189 may include non-rechargeable primary cells, rechargeable secondary cells, and/or fuel cells.

The communication module 1190 may establish a wired communication channel and/or a wireless communication channel between the electronic apparatus 1101 and another electronic apparatus (the electronic apparatus 1102, the electronic apparatus 1104, the server 1108, and the like), and support a communication through an established communication channel. The communication module 1190 may be operated independent of the processor 1120 (the application processor, and the like), and may include one or more communication processors supporting a wired communication and/or a wireless communication. The communication module 1190 may include a wireless communication module 1192 (a cellular communication module, a short-range wireless communication module, a global navigation satellite system (GNSS) communication module, and the like), and/or a wired communication module 1194 (a local area network (LAN) communication module, a power line communication module, and the like). Among the above communication modules, a corresponding communication module may communicate with another electronic apparatus through the first network 1198 (a short-range communication network such as Bluetooth, WiFi Direct, or infrared data association (IrDA)) or the second network 1199 (a long-range communication network such as a cellular network, the Internet, or a computer network (LAN, WAN, and the like)). These various types of communication modules may be integrated into one constituent element (a single chip, and the like), or may be implemented as a plurality of separate constituent elements (multiple chips). The wireless communication module 1192 may verify and authenticate the electronic apparatus 1101 in a communication network such as the first network 1198 and/or the second network 1199 by using subscriber information (an international mobile subscriber identifier (IMSI), and the like) stored in the subscriber identification module 1196.

The antenna module 1197 may transmit signals and/or power to the outside (another electronic apparatus, and the like) or receive signals and/or power from the outside. An antenna may include an emitter formed in a conductive pattern on a substrate (a printed circuit board (PCB), and the like). The antenna module 1197 may include one or a plurality of antennas. When the antenna module 1197 includes a plurality of antennas, the communication module 1190 may select, from among the antennas, an appropriate antenna for a communication method used in a communication network such as the first network 1198 and/or the second network 1199. Signals and/or power may be transmitted or received between the communication module 1190 and another electronic apparatus through the selected antenna. Other parts (an RFIC, and the like) than the antenna may be included as a part of the antenna module 1197.

Some of the constituent elements may be connected to each other through a communication method between peripheral devices (a bus, general purpose input and output (GPIO), a serial peripheral interface (SPI), a mobile industry processor interface (MIPI), and the like) and may mutually exchange signals (commands, data, and the like).

The instruction or data may be transmitted or received between the electronic apparatus 1101 and the external electronic apparatus 1104 through the server 1108 connected to the second network 1199. The electronic apparatuses 1102 and 1104 may be of a type that is the same as or different from the electronic apparatus 1101. All or a part of operations executed in the electronic apparatus 1101 may be executed in one or more electronic apparatuses (1102, 1104, and 1108). For example, when the electronic apparatus 1101 needs to perform a function or service, the electronic apparatus 1101 may request one or more electronic apparatuses to perform part of or the whole of the function or service, instead of performing the function or service. The one or more electronic apparatuses receiving the request may perform additional function or service related to the request, and transmit a result of the performance to the electronic apparatus 1101. To this end, cloud computing, distributed computing, and/or client-server computing technology may be used.

Figure 19:
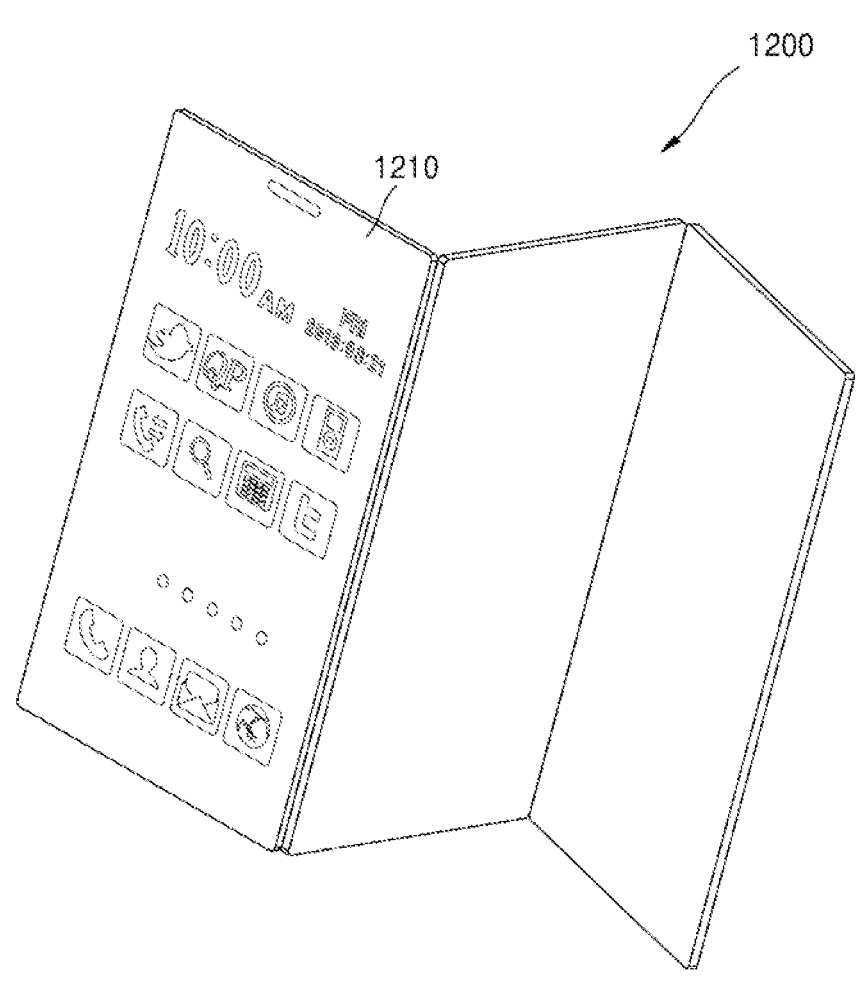
FIG. 19 is a diagram illustrating an example in which a display apparatus according to embodiments is applied to a mobile device.

FIG. 19 is a diagram illustrating an example in which a display apparatus according to embodiments is applied to a mobile device. A mobile device 1200 may include a display apparatus 1210, and the display apparatus 1210 may include the driving circuit, the semiconductor light emitting device (100, 100*a*, 100*b*, 100*c*, 100*d*, 100*e*, 100*f*, 100*g*, and 100*h*), the lateral reflection structure, the lower reflection structure, etc. The display apparatus 1210 may have a foldable structure, for example, a multi-foldable structure.

Figure 20:
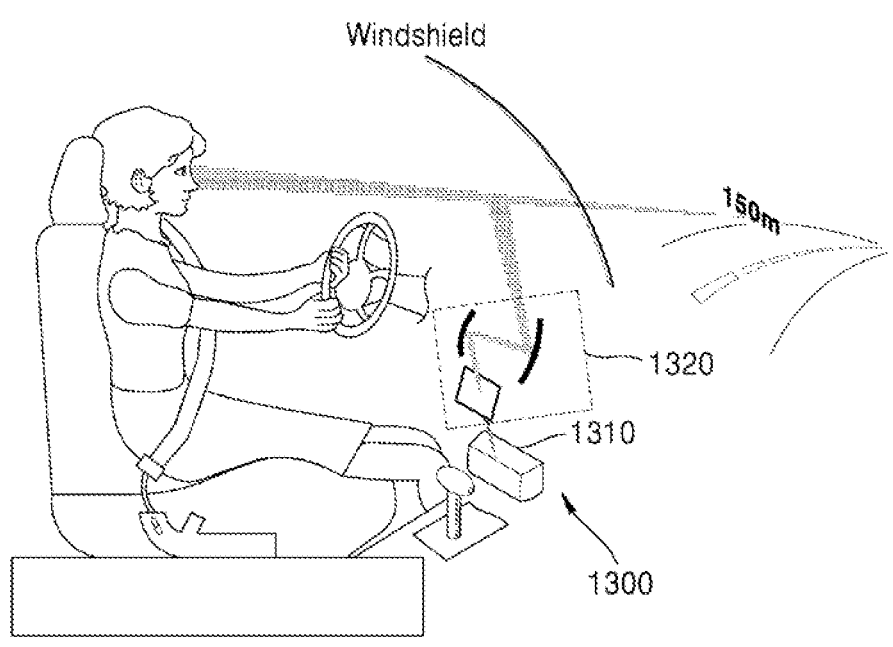
FIG. 20 is a diagram illustrating an example in which a display apparatus according to embodiments is applied to a display apparatus for vehicles.

FIG. 20 is a diagram illustrating an example in which a display apparatus according to embodiments is applied to a display apparatus for vehicles. The display apparatus may be a head-up display apparatus for vehicle 1300 and may include a display 1310 and an optical path change member 1320 configured to change an optical path so that a driver can see an image generated at the display 1310.

Figure 21:
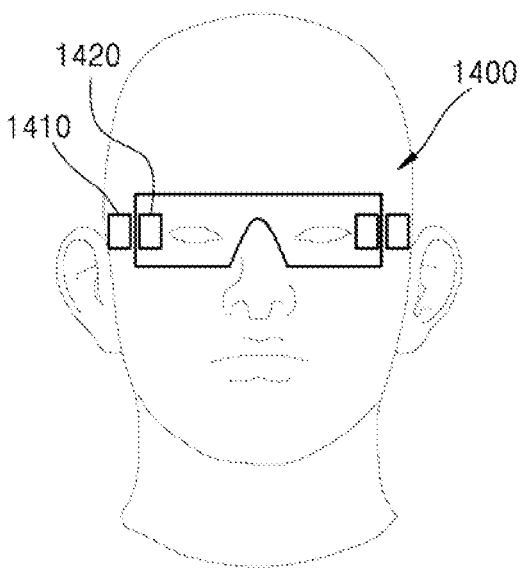
FIG. 21 is a diagram illustrating an example in which a display apparatus according to embodiments is applied to augmented reality glasses or virtual reality glasses.

FIG. 21 is a diagram illustrating an example in which a display apparatus according to embodiments is applied to augmented reality glasses or virtual reality glasses. The augmented reality glasses 1400 may include a projection system 1410 configured to form an image and a guiding element 1420 configured to guide the image from the projection system 1410 to user's eyes. The projection system 1410 may include the driving circuit, the micro-semiconductor light emitting device 100, the lateral reflection structure, the lower reflection structure, etc.

Figure 22:
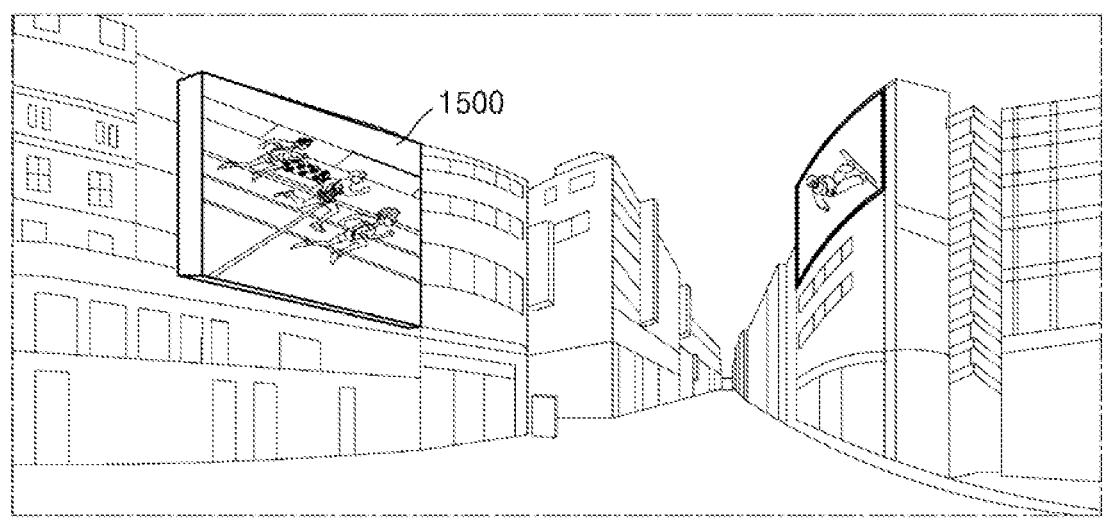
FIG. 22 is a diagram illustrating an example in which a display apparatus according to embodiments is applied to signage.

FIG. 22 is a diagram illustrating an example in which a display apparatus according to embodiments is applied to signage. A signage 1500 may be used for outdoor advertisement using a digital information display, and may control the advertisement contents through a communication network. The signage 1500 may be implemented through, for example, the electronic apparatus described with reference to FIG. 18.

Figure 23:
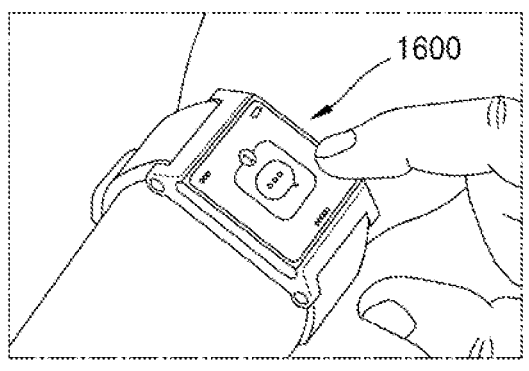
FIG. 23 is a diagram illustrating an example in which a display apparatus according to embodiments is applied to a wearable display.

FIG. 23 is a diagram illustrating an example in which a display apparatus according to embodiments is applied to a wearable display. A wearable display 1600 may include the driving circuit, the micro-semiconductor light emitting device 100, the lateral reflection structure, the lower reflection structure, etc. and may be implemented through the electronic apparatus described with reference to FIG. 18.

The display apparatus according to an embodiment may also be applied to various products such as rollable TV, stretchable display, etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A Gallium-Nitride light emitting device comprising:
   a n-GaN semiconductor layer doped with an n-type dopant;
   a p-GaN semiconductor layer spaced apart from the n-GaN semiconductor layer and doped with a p-type dopant;

an active layer arranged between the n-GaN semiconductor layer and the p-GaN semiconductor layer, the active layer comprising at least one of quantum well configured to emit light; and a strain relaxing layer arranged between the active layer and the n-GaN semiconductor layer and comprising a plurality of indium clusters and a plurality of voids and not comprising the at least one of quantum well, the strain relaxing layer relaxing strain generated by a lattice constant difference between the n-GaN semiconductor layer and the active layer; and a planarization layer contacting a top surface of the strain relaxing layer between the active layer and the strain relaxing layer, the planarization layer planarizing the top surface of the strain relaxing layer and having a thickness that is less than the thickness of the strain relaxation layer, wherein the lattice constant difference between the n-GaN semiconductor layer and the active layer is greater than or equal to 0.02 angstroms and less than or equal to 0.05 angstroms, and an indium content of the active layer is greater than or equal to 30% and an indium content of the strain relaxing layer is greater than or equal to 5% and less than 30%, wherein a ratio of a total volume of the indium clusters to a total volume of the strain relaxing layer is greater than or equal to 0.01 and less than or equal to 0.3 and a ratio of a total volume of the voids to a total volume of the strain relaxing layer is more than or equal to a ratio of a total volume of the indium clusters to the total volume of the strain relaxing layer.

2. The Gallium-Nitride light emitting device of claim 1, wherein each of the plurality of indium clusters comprises two or more indium atoms.

3. The Gallium-Nitride light emitting device of claim 2, wherein for each of the plurality of indium clusters, the two or more indium atoms are metallically bonded.

4. The Gallium-Nitride light emitting device of claim 1, wherein a ratio of a total volume of the indium clusters to a total volume of the strain relaxing layer is less than or equal to a ratio of a total volume of the voids to the total volume of the strain relaxing layer.

5. The Gallium-Nitride light emitting device of claim 1, wherein a ratio of a total volume of the indium clusters to a total volume of the strain relaxing layer is greater than or equal to 0.01 and less than or equal to 0.3.

6. The Gallium-Nitride light emitting device of claim 1, wherein the strain relaxing layer comprises $In_{x-y}Ga_{1-x}N$ ($0.05 \leq x-y < 0.30$).

7. The Gallium-Nitride light emitting device of claim 1, wherein a size of each of the plurality of voids is greater than or equal to about 10 nm and less than or equal to about 500 nm.

8. The Gallium-Nitride light emitting device of claim 1, wherein the active layer is configured to emit light having a wavelength of about 560 nm to about 750 nm.

9. The Gallium-Nitride light emitting device of claim 1, wherein a width of the Gallium-Nitride light emitting device is about 0.3 μm to about 1 μm, and wherein a ratio of a length of the Gallium-Nitride light emitting device to the width of the Gallium-Nitride light emitting device is greater than or equal to 3.

10. A display apparatus comprising:

a display device layer comprising a plurality of light emitting devices; and a driving device layer comprising a plurality of transistors electrically connected to the plurality of light emitting devices, the driving device layer configured to drive the plurality of light emitting devices, wherein at least one of the plurality of light emitting devices comprises the Gallium-Nitride light emitting device of claim 1.

11. The display apparatus of claim 10, wherein the at least one of the plurality of light emitting devices is configured to emit light having a wavelength of about 500-560 nm to about 750 nm.

12. The display apparatus of claim 10, wherein the plurality of light emitting devices further comprises a first light emitting device configured to emit light having a wavelength of about 620 nm to about 750 nm, a second light emitting device configured to emit light having a wavelength of about 495 nm to about 570 nm and a third light emitting device configured to emit light having a wavelength of about 420 nm to about 495 nm.

13. The display apparatus of claim 12, wherein the first light emitting device, the second light emitting device, and the third light emitting device have indium contents different from each other.

14. A method of manufacturing a Gallium-Nitride light emitting device, the method comprising:

growing a n-GaN semiconductor layer on a base substrate;

growing a strain source layer comprising indium on the n-GaN semiconductor layer;

heat-treating the strain source layer to form a strain relaxing layer comprising a plurality of indium clusters and a plurality of voids;

growing a planarization layer on a top surface of the strain relaxing layer, the planarization layer planarizing the top surface of the strain relaxing layer and having a thickness that is less than a thickness of the strain relaxing layer;

growing an active layer on planarization layer, the active layer comprising at least one of quantum well configured to emit light;

growing a p-GaN semiconductor layer on the active layer to form a Gallium-Nitride light emitting structure, wherein the strain relaxing layer does not comprise the at least one of quantum well, and the strain layer relaxes a strain generated by a lattice constant difference between the n-GaN semiconductor layer and the active layer, and wherein the lattice constant difference between the n-GaN semiconductor layer and the active layer is greater than or equal to 0.02 angstroms and less than or equal to 0.05 angstroms, and an indium content of the active layer is greater than or equal to 30% and an indium content of the strain relaxing layer is greater than or equal to 5% and less than 30%, wherein a ratio of a total volume of the indium clusters to a total volume of the strain relaxing layer is greater than or equal to 0.01 and less than or equal to 0.3 and a ratio of a total volume of the voids to a total volume of the strain relaxing layer is more than or equal to a ratio of a total volume of the indium clusters to the total volume of the strain relaxing layer.

15. The method of claim 14, wherein the heat-treating of the strain source layer comprises applying, to the strain source layer, a heat-treating temperature higher than a growth temperature of the strain source layer.

16. The method of claim 15, wherein the heat-treating temperature is at least 100° C. greater than the growth temperature.

17. The method of claim 14, wherein the heat-treating of the strain source layer comprises separating indium atoms in the strain source layer from other materials in the strain source layer and causing the separated indium atoms to bond to each other to form the plurality of indium clusters.

18. The method of claim 14, wherein the heat-treating of the strain source layer comprises applying heat to the strain source layer in a nitrogen or ammonia-mixed atmosphere.

* * * * *